(12) United States Patent
Sarayama et al.

(10) Patent No.: US 6,780,239 B2
(45) Date of Patent: Aug. 24, 2004

(54) CRYSTAL GROWTH METHOD, CRYSTAL GROWTH APPARATUS, GROUP-III NITRIDE CRYSTAL AND GROUP-III NITRIDE SEMICONDUCTOR DEVICE

(75) Inventors: Seiji Sarayama, Miyagi (JP); Masahiko Shimada, Miyagi (JP); Hisanori Yamane, Miyagi (JP); Masato Aoki, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 105 days.

(21) Appl. No.: 09/981,848

(22) Filed: Oct. 16, 2001

(65) Prior Publication Data

US 2002/0046695 A1 Apr. 25, 2002

(30) Foreign Application Priority Data

Oct. 19, 2000 (JP) ........................... 2000-318723
Oct. 19, 2000 (JP) ........................... 2000-318988
Oct. 24, 2000 (JP) ........................... 2000-324272

(51) Int. Cl.$^7$ ............................................. C30B 17/00
(52) U.S. Cl. ............................................. 117/36
(58) Field of Search .................... 117/11, 36, 41, 117/54, 56, 64

(56) References Cited

U.S. PATENT DOCUMENTS

| | | | |
|---|---|---|---|
| 5,868,837 A | | 2/1999 | DiSalvo et al. |
| 5,977,612 A | * | 11/1999 | Bour et al. ............... 257/618 |
| 6,165,874 A | * | 12/2000 | Powell et al. ............ 438/478 |
| 6,214,427 B1 | * | 4/2001 | Levinson ................... 428/43 |
| 6,270,569 B1 | * | 8/2001 | Shibata et al. ............ 117/68 |
| 6,271,104 B1 | * | 8/2001 | Razeghi et al. .......... 438/481 |
| 2002/0175324 A1 | * | 11/2002 | Razeghi .................... 257/14 |

FOREIGN PATENT DOCUMENTS

| | | |
|---|---|---|
| JP | 10256662 | 9/1998 |
| JP | 200012900 | 1/2000 |
| JP | 200022212 | 1/2000 |
| JP | 2000327495 | 11/2000 |

OTHER PUBLICATIONS

Gavrilin et al., Liquid Phase epitaxy of GaN from Gallium–Lithium Melts., Perspektivnye Materialy (1999), (2), pp. 22–25, 1999. (in Russian.).*
Klemenz et al., Crystal Growth and Liquid–Phase Epitaxy of Gallium Nitride, Journmal of Crystal Growth (2000), 211(1–4), pp. 62–67, 2000.*
Shuji Nakamura et al . "InGaN/GaN/AlGaN–Based Laser Diodes with Modulation–Doped Strained–Layer Superlattices", pp. L1568–L1571.
Shuji Nakamura et al . "InGaN/GaN/AlGaN–Based Laser Diodes with Laser Diodes with Cleaved Facets Grown on GaN Substrates", pp. 832–834.
Sylwester Porowski, "Bulk and Homoepitaxial GaN–growth and Characteristisation", pp. 153–158.
Hisanori Yamane et al. "Preparation of GaN Single Crystal Using a Na Flux", pp. 413–416.
Appln. Ser. No. 09/590,063 filed Jun. 8, 2000.

* cited by examiner

Primary Examiner—Nadine G. Norton
Assistant Examiner—Matthew A. Anderson
(74) Attorney, Agent, or Firm—Cooper & Dunham LLP

(57) ABSTRACT

A crystal growth method, comprising the steps of: a) bringing a nitrogen material into a reaction vessel in which a mixed molten liquid comprising an alkaline metal and a group-III metal; and b) growing a crystal of a group-III nitride using the mixed molten liquid and the nitrogen material brought in by the step a) in the reaction vessel, wherein a provision is made such as to prevent a vapor of the alkaline metal from dispersing out of the reaction vessel.

20 Claims, 19 Drawing Sheets

CRYSTAL GROWTH METHOD, CRYSTAL GROWTH APPARATUS, GROUP-III NITRIDE CRYSTAL AND GROUP-III NITRIDE SEMICONDUCTOR DEVICE

BACKGROUND OF THE INVENTION

1. Field of the Invention

The present invention relates to a crystal growth method, a crystal growth apparatus, a group-III nitride crystal, and a group-III nitride semiconductor device. In particular, the present invention relates to a crystal growth method and a crystal growth apparatus for a group-III nitride crystal, the group-III nitride crystal, and a group-III nitride semiconductor device-employing the group-III nitride crystal applicable to a blue light source for an optical disk drive, for example.

2. Description of the Related Art

Now, a InGaAlN-family (group-III nitride) device used as violet through blue through green light sources is produced by a crystal growth process employing an MO-CVD method (organic metal chemical vapor phase growth method), an MBE method (molecular beam crystal growth method), etc. on a sapphire or SiC substrate in most cases. In using sapphire or SiC as a substrate, crystal defect caused due to a large expansivity difference and/or lattice constant difference from a group-III nitride may occur frequently. By this reason, there is a problem that the device characteristic may become worth, it may be difficult to lengthen the life of the light-emission device, or the electric power consumption may become larger.

Furthermore, since a sapphire substrate has an insulating property, drawing of an electrode from the substrate like in another conventional light-emission device is impossible, and therefore, drawing the electrode from the nitride semiconductor surface on which crystal was grown is needed. Consequently, the device area may have to be enlarged, and, thereby, the costs may increase. Moreover, chip separation by cleavage is difficult for a group-III nitride semiconductor device produced on a sapphire substrate, and it is not easy to obtain a resonator end surface needed for a laser diode (LD) by cleavage, either. By this reason, a resonator end surface formation according to dry etching, or, after grinding a sapphire substrate to the thickness of 100 micrometers or less, a resonator end surface formation in a way near cleavage should be performed. Also in such a case, it is impossible to perform formation of a resonator end surface and chip separation easily by a single process like for another conventional LD, and, also, complication in process, and, thereby, cost increase may occur.

In order to solve these problems, it has been proposed to reduce the crystal defects by employing a selective lateral growth method and/or another technique for forming a group-III nitride semiconductor film on a sapphire substrate.

For example, a document 'Japanese Journal of Applied Physics, Vol. 36 (1967), Part 2, No. 12A, pages L1568–1571' (referred to as a first prior art, hereinafter) discloses a laser diode (LD) shown in FIG. 1. This configuration is produced as follows: After growing up a GaN low-temperature buffer layer 2 and a GaN layer 3, one by one, on a sapphire substrate 1 by an MO-VPE (organometallic vapor phase epitaxy) apparatus, an $SiO_2$ mask 4 for selective growth is formed. This $SiO_2$ mask 4 is formed through photo lithography and etching process, after depositing a $SiO_2$ film by another CVD (chemistry vapor phase deposition) apparatus. Next, on this $SiO_2$ mask 4, again, a GaN film 3' is grown up to a thickness of 20 micrometers by the MO-VPE apparatus, and, thereby, GaN grows laterally selectively, and, as a result, the crystal defects are reduced as compared with the case where the selective lateral growth is not performed. Furthermore, prolonging of the crystal defect toward an activity layer 6 is prevented by provision of a modulation doped strained-layer superlattice layer (MD-SLS) 5 formed thereon. Consequently, as compared with the case where the selective lateral growth and modulation doped strained-layer superlattice layer are not used, it becomes possible to lengthen the device life.

In the case of this first prior art, although it becomes possible to reduce the crystal defects as compared with the case where the selective lateral growth of a GaN film is not carried out on a sapphire substrate, the above-mentioned problems concerning the insulating property and cleavage by using a sapphire substrate still remain. Furthermore, as the $SiO_2$ mask formation process is added, the crystal growth by the MO-VPE apparatus is needed twice, and, thereby, a problem that a process is complicated newly arises.

As another method, for example, a document 'Applied Physics Letters, Vol. 73, No. 6, pages 832–834 (1998)' (referred to as a second prior art, hereinafter) discloses application of a GaN thick film substrate. By this second prior art, a GaN substrate is produced, by growing up a 200-micrometer GaN thick film by an H-VPE (hydride vapor phase growth) apparatus after 20-micrometer selective lateral growth according to the above-mentioned first prior art, and, then, grinding the GaN substrate thus having grown to be the thick film from the side of the sapphire substrate so that it may have the thickness of 150 micrometers. Then, the MO-VPE apparatus is used on this GaN substrate, crystal growth processes required for a LD device are performed, one by one, and, thus, the LD device is produced. Consequently, it becomes possible to solve the above-mentioned problems concerning the insulating property and cleavage by using the sapphire substrate in addition to solving the problem concerning the crystal defects.

A similar method is disclosed by Japanese Laid-Open Patent Application No. 11-4048. FIG. 7 shows a typical figure thereof.

However, further, the process is more complicated in the second prior art, and, requires the higher costs, in comparison to the first prior art. Moreover, in growing up the no less than 200 micrometer GaN thick film by the method of the second prior art, a stress occurring due to a lattice constant difference and a expansivity difference from the sapphire of the substrate becomes large, and a problem that the curvature and the crack of the substrate arise may newly occur. Moreover, even by performing such a complicated process, the crystal defective density can be reduced to only on the order of $10^6/cm^2$. Thus, it is not possible to obtain a practical semiconductor device.

In order to avoid this problem, setting to 1 mm or more thickness of an original substrate (sapphire and spinel are the most desirable materials as the substrate) from which a thick film grows is proposed by Japanese Laid-Open Patent Application No. 10-256662. According thereto, no curvature nor crack arise in the substrate even when the GaN film grows in 200 micrometers of thickness by applying this substrate having the thickness of 1 mm or more. However, a substrate thick in this way has a high cost of the substrate itself, and it is necessary to spend much time on polish thereof, and leads to the cost rise of the polish process. That is, as compared with the case where a thin substrate is used, the cost becomes higher by using the thick substrate. Moreover, although no curvature nor crack arise in the substrate after growing up the thick GaN film in using the thick substrate, curvature and/or crack may occur as stress relief occurs during the process of polish. By this reason, even when the thick substrate is used, the GaN substrate having a high crystal quality and having such a large area that it can be practically used for an ordinary semiconductor device manufacturing process cannot be easily produced.

A document 'Journal of Crystal Growth, Vol. 189/190, pages. 153–158 (1998)' (referred to as a third prior art, hereinafter) discloses that a bulk crystal of GaN is grown up, and it is used as a homoepitaxial substrate. According to this technique, under the high temperature in the range between 1400 and 1700° C., and under the very high nitrogen pressure of 10 kilobars, crystal growth of the GaN is performed from a Ga liquid. In this case, it becomes possible to grow up a group-III nitride semiconductor film required for a device by using this GaN substrate. Therefore, it is possible to provide the GaN substrate without needing the process complicate like in the above-described first and second prior arts.

However, by this third prior art, crystal growth in high temperature and high pressure is needed, and, thus, there is a problem that a reaction vessel which can resist these conditions should be very expensive. In addition, even when such a growth method is employed, the size of the crystal obtained has the problem of being too small, i.e., at most on the order of 1 cm, and, thus, it is too small to put it in practical use of semiconductor device manufacture.

The GaN crystal growth method using Na which is an alkaline metal as a flux is proposed by a document 'Chemistry of Materials, Vol. 9 (1977), pages 413–416' (referred to as a fourth prior art, hereinafter) as a technique of solving the problem of GaN crystal growth in the above-mentioned high temperature and high pressure. According to this technique, sealing sodium azide ($NaN_3$) and Ga metal used as a flux and a material into a reaction vessel made from stainless steel (vessel inner dimension: diameter=7.5 mm and length=100 mm) in nitrogen atmosphere, and the reaction vessel is maintained in the temperature in the range between 600 and 800° C. for 24 to 100 hours to grow up a GaN crystal. In the case of this fourth prior art, crystal growth at the comparatively low temperature in the range between 600 and 800° C. can be achieved, and, also, the require pressure inside the vessel should be only on the order of 100 $kg/cm^2$, which is comparatively lower than the case of the third prior art. However, in this fourth prior art, the size of the crystal obtained is small as less than 1 mm which is too small to be put into practical use in semiconductor device manufacture, like in the case of the third prior art.

Therefore, the applicant of the present application has proposed a method of enlarging a group-III nitride crystal. However, in the method, nucleus generation initiates of the crystal growth is natural nucleus generation, and, thus, a large number of nucleus are undesirably generated. In order to control this nucleus generation, the applicant has proposed to utilize a seed crystal in the U.S. patent application Ser. No. 09/590,063, filed on Jun. 8, 2000, by Seiji Sarayama et al. (the entire contents of which are hereby incorporated by reference). However, there is a problem that a required crystal growth apparatus becomes complicated. Therefore, it has been demanded to realize a method for effectively controlling nucleus generation, while achieving a simple apparatus configuration of a conventional flux method, in order to solve this problem.

Further, Japanese Laid-Open Patent Application No. 2000-327495 discloses a fifth prior art combining the above-mentioned fourth prior art and an epitaxial method utilizing a substrate. In this method, a substrate on which GaN or AlN is grown previously is used, and, thereon, a GaN film according to the fourth prior art is grown. However, in this method, as it is basically the epitaxial method, the problem of crystal defects occurring in the above-mentioned first and second prior art cannot be solved. Further, as the GaN film or AlN film should be grown on the substrate previously, the process becomes complicated, and, thereby, the costs increase.

Furthermore, recently, Japanese Laid-Open Patent Applications Nos. 2000-12900 and 2000-22212 disclose a sixth prior art in which a GaAs substrate is used and a GaN thick-film substrate is produced. In this method, a GaN film having a thickens in a range between 70 $\mu m$ and 1 mm is selectively grown on a GaAs substrate by using an $SiO_2$ film or SiN film as a mask as in the above-mentioned first prior art, as shown in FIGS. 3A through 3C. The crystal growth there is performed by the H-VPE apparatus. Then, the GaAs substrate is etched and thus removed by using aqua regia. Thus, the GaN self-standing substrate is produced, as shown in FIG. 3D. By using this GaN-self standing substrate, a GaN crystal having a thickness of several tens of millimeters is grown by vapor phase epitaxy by the H-VPE apparatus again, as shown in FIG. 4A. Then, this GaN crystal of several tens millimeters is cut into wafer shapes by a slicer, as shown in FIG. 4B. Thus, GaN wafers are produced, as shown in FIG. 4C.

According to this sixth prior art, the GaN self-standing substrate can be obtained, and, also, the GaN crystal having the thickness of several tens of millimeters can be obtained. However, this method has the following problems:

① As the SiN film or $SiO^2$ film is used as a mask for selective growth, the manufacturing process becomes complicated, and, thus, the costs increase;

② When the GaN crystal having the thickness of several tens millimeters is grown by the H-VPE apparatus, GaN crystals (in monocrystal or polycrystal) or amorphous GaN having a similar thickness adhere to the inner wall of the reaction vessel. Accordingly, the productivity is degraded thereby.

③ As the GaAs substrate is etched and removed every time of the crystal growth as a sacrifice substrate, the costs increase thereby.

④ With regard to the crystal quality, problems of lattice mismatch due to crystal growth on a different-substance substrate, and a high defect density due to difference in expansivity remain.

SUMMARY OF THE INVENTION

An object of the present invention is to achieve a group III nitride crystal having a sufficient size such that a semiconductor device, such as a high-efficient light emitting diode or LD can be produced therefrom, without complicating the process which is the problem in the above-mentioned first or the second prior art, without using an expensive reaction vessel which is the problem in the third prior art, and without provision of insufficient size of the crystal which is the problem in the third and fourth prior arts, and, also, solving the above-mentioned problems in the fifth and sixth prior arts, and a crystal growth method and a crystal growth apparatus by which such a group-III nitride crystal can be manufactured, and a high-performance group-III nitride semiconductor device.

A crystal growth method according to the present invention, includes the steps of:
  a) providing a nitrogen material into a reaction vessel in which a mixed molten liquid comprising an alkaline metal and a group-III metal; and
  b) growing a crystal of a group-III nitride using the mixed molten liquid and the nitrogen material provided in the step a) in the reaction vessel,
  wherein a provision is made such as to prevent a vapor of the alkaline metal from dispersing out of the reaction vessel.

Thereby, when growing up the group-III nitride crystal in the reaction vessel especially using the alkaline metal and the mixed molten liquid which contains group-III metal at least and the nitrogen material brought from the outside of the reaction vessel, the alkaline metal vapor is prevented from dispersing out of the reaction vessel. Thereby, evaporation of the alkaline metal out of the reaction vessel and condensation thereof can be prevented and it becomes possible to avoid obstruction against supply of the nitrogen material, and thus change of material composition. Consequently, the crystal growth can be well controlled, and a satisfactory group-III nitride crystal can be grown up stably.

A crystal growth method according to another aspect of the present invention includes the steps of:
  a) providing a nitrogen material into a reaction vessel in which a mixed molten liquid comprising an alkaline metal and a group-III metal; and
  b) growing a crystal of a group-III nitride using the mixed molten liquid and the nitrogen material provided in the step a) in the reaction vessel,
  wherein a provision is made such as to prevent a vapor of the alkaline metal from blocking a zone through which the nitrogen material is supplied from the outside of the reaction vessel.

Thereby, the nitrogen material brought in from the outside of the reaction vessel can be prevented from being blocked by the condensed alkaline metal.

Consequently, the crystal growth can be well controlled, and, a satisfactory group-III nitride crystal can be grown up stably.

For this purpose, the temperature in the reaction vessel above the surface of the mixed molten liquid may be preferably controlled so as to prevent the vapor of the alkaline metal from condensing.

The temperature of the above-mentioned zone may preferably be controlled for the same purpose.

Further, another reaction vessel may be provided outside of the reaction vessel;
  the nitrogen material may be brought into the reaction vessel through this outer reaction vessel; and
  a provision may preferably be made such as to allow the nitrogen material to be brought into the originally provided inner reaction vessel from the outer reaction vessel, and, also, to prevent the vapor of the alkaline metal from dispersing out of the inner reaction vessel, for the above-mentioned object.

The nitrogen material may be preferably supplied horizontally or from a direction below the horizontal direction.

Thereby, condensation of the alkaline metal vapor in the zone through which the nitrogen material is supplied can be prevented.

A crystal growth apparatus according to the present invention includes:
  a reaction vessel holding a mixed molten liquid comprising an alkaline metal and a group-III metal;
  a first heating device heating the mixed molten liquid so as to enable crystal growth therein; and
  a second heating device heating above the surface of the mixed molten liquid so as to prevent the vapor of the alkaline metal above the surface of the mixed molten liquid from condensing.

A crystal growth apparatus according to another aspect of the present invention includes:
  a reaction vessel holding a mixed molten liquid comprising an alkaline metal and a group-III metal; and
  a heating device heating a zone through which a nitrogen material is supplied externally into the reaction vessel.

Thereby, a complicated process described above for the first or second prior art is not needed, but it becomes possible to obtain a high-quality group-III nitride crystal at low cost. Furthermore, the required growth temperature is as low as less than 100° C., and, also, the required growth pressure is as low as less than 100 kg/cm$^2$, for the crystal growth of the group-III nitride. Accordingly, it is not necessary to use an expensive reaction vessel which can resist a super-high pressure and a super-high temperature as in the above-mentioned third prior art. Consequently, it becomes possible at low cost to obtain a group-III nitride crystal. Moreover, since it is low temperature and low pressure needed for the crystal growth, it becomes possible by using a seed crystal as a nucleus to enlarge the size of the group-III nitride crystal by carrying out crystal growth.

A crystal growth method according to another aspect of the present invention includes the steps of:
  a) carrying out crystal growth in a reaction vessel of a group-III nitride comprising a group-III metal and a nitrogen from an alkaline metal, a substance comprising the group-III metal, and a substance comprising the nitrogen; and
  b) maintaining a growth condition for a crystal the group-III nitride at a condition at which the crystal growth starts; then,
  c) maintaining the growth condition at a condition at which the crystal growth stops; and, then,
  d) again setting the condition at which the crystal growth starts.

Thus, by setting the crystal growth condition enabling the crystal growth and then setting the other crystal growth condition not enabling the crystal growth, a crystal nucleus can be grown selectively. That is, by setting again the crystal growth condition enabling the crystal growth, the crystal growth progresses further from this crystal nucleus. By repeating such a control of the crystal growth condition as that the crystal growable condition is entered and exited from, it is possible to control generation of crystal nucleus, in comparison to a case where no such a control is performed. Thus, it becomes possible to grow the group-III nitride crystal to have a large size effectively, and thus to effectively utilize the materials therefor. As a result, it is possible to obtain a large-sized group-III nitride crystal at low cost.

Further, in comparison to a seed-crystal method in the related art in which a position of a crystal nucleus supplied externally as a seed crystal is controlled, the apparatus is not needed to be so complicated, and, thus, the total cost can be reduced, according to the present invention.

Specifically, the step b) may maintain the temperature of a zone in which a crystal of the group-III nitride grows at a temperature at which the crystal growth starts;
  the step c) may lower the temperature of the zone to a temperature such that no alloy is formed between the group-III metal and another metal, and maintaining this temperature; and the step d) may increase the temperature to the temperature at which the crystal growth starts again.

The increase and decrease of the temperature may be preferably performed several times.

The substance comprising the nitrogen may be of a gas, and the gas may be supplied into the reaction vessel continuously at a predetermined pressure. Thereby, it is possible to control the crystal growth reaction only by control of the temperature. As a result, it is possible to control a change in growth parameter in the crystal growth, and, also, by continuously supplying the nitrogen material, a high-quality group-III nitride crystal can be grown with little nitrogen loss.

The substance comprising the group-III metal may preferably be additionally provided at a time of the temperature is lowered.

Thereby, it is possible to avoid a situation of unexpected interruption of the crystal growth occurring due to exhaustion of the group-III material. Furthermore, it is possible to effectively prevent change of the ratio in amount among the group-III material and group-V material, and the alkaline metal used as the flux. As a result, it is possible to achieve stable crystal growth wherein the crystal quality is fixed stably, and, thus, it is possible to grow up a high-quality group-III nitride crystal.

Furthermore, as the timing of the additional supply of the group-III material is in an interval in which the crystal growth is terminated, it is possible to effectively control change in grow parameter such as temperature change, material amount ratio change and so forth which may otherwise adversely affect the proper crystal growth. Also by this point, the crystal growth for a high-quality group-III nitride crystal can be more positively achieved.

The above-mentioned step b) may instead maintain an effective pressure of the substance comprising the nitride in a form a gas in a zone in which a crystal of the group-III nitride grows at a pressure at which the crystal growth starts;

the step c) may lower the effective pressure of the nitrogen gas in the zone to a pressure such that the crystal growth stops, and maintaining this pressure; and the step d) may increase the effective pressure of the nitrogen gas to the pressure at which the crystal growth starts again.

Further, a crystal growth apparatus which carries out crystal growth of the group-III nitride crystal which has the features described above can be realized at low cost in addition to the above-mentioned effects.

Furthermore, by carrying out the crystal growth according to any one of the above-described methods and/or the above-mentioned apparatuses, it becomes possible to realize a large-sized group-III nitride crystal by which a semiconductor device may be produced in a practical manner at low cost.

Furthermore, by producing the group-III nitride semiconductor device using the group-III nitride crystal mentioned above, a highly efficient device is realizable at low cost. This group-III nitride crystal is a high-quality crystal having few crystal defects, as mentioned above. Thus, a highly efficient device is realizable by device production from thin film growth using this group-III nitride crystal, or using it as a substrate of the device. That is, a high output which has not been realized conventionally can be provided by the device and a long life of the device is achieved in a case of production of a semiconductor laser or a light emitting diode therefrom. In a case of production of an electronic device therefrom, low power consumption, low noise, high-speed operation, and high temperature operation are achievable therefrom. In a case of light receiving device, low noise and a long life can be obtained therefrom.

A crystal growth method according to another aspect of the present invention includes the steps of:

a) forming a mixed molten liquid comprising an alkaline metal and a substance comprising a group-III metal in a liquid holding vessel;

b) growing in the liquid holding vessel a crystal of a group-III nitride comprising the group-III metal and nitride from the mixed molten liquid and a substance comprising the nitride;

c) creating a local concentration distribution of dissolved nitrogen in the mixed molten liquid in the liquid holding vessel during the step b).

Thereby, without making the process complicated as in the first and second prior arts described above, since the local concentration distribution of the dissolved nitrogen is produced in the mixed molten liquid, it becomes possible to avoid use of an expensive reaction vessel as in the third prior art, and the size of the produced crystal can be enlarged in contrast to the third and fourth prior art. Thus, the group-III nitride crystal of a practical size for producing semiconductor devices, such as a highly efficient light emitting diode and LD, can be grown up.

Furthermore, the necessary growth temperature is as low as 1000 degrees C. or less, and, also, the necessary growth pressure is as low as approximately 100 or less atm. Thereby, it is not necessary to use an expensive reaction vessel which can resist a super-high pressure and a super-high temperature as in the third prior art. Consequently, it becomes possible to realize the device using the group-III nitride crystal at low cost.

Furthermore, by producing the local concentration (uneven) distribution of the dissolved nitrogen in the mixed molten liquid, it becomes possible to limit a location of occurrence of nucleus generation of the group-III nitride crystal to a specific part of the mixed molten liquid, and the group-III nitride crystal having a large size can thus be grown up.

The liquid holding vessel may have an inner shape such as to produce the local concentration distribution of the dissolved nitrogen in the mixed molten liquid.

The inner shape of the liquid holding vessel may be such that the cross sectional area becomes smaller downward.

The inner shape of the liquid holding vessel may instead be such that the cross sectional area is reduced partially (at a specific height).

The inner shape of the liquid holding vessel may future instead be such that the cross sectional area becomes smaller downward first, and, then, the cross sectional area is uniform downward from the mid level (height).

The inner shape of the liquid holding vessel may further instead be such that the cross sectional area becomes smaller downward first, and, then, the cross sectional area becomes larger downward from the mid level.

A crystal growth apparatus according to another aspect of the present invention includes:

a liquid holding vessel in which a mixed molten liquid comprising an alkaline metal and a substance comprising a group-III metal is formed; and a unit growing in the liquid holding vessel a crystal of a group-III nitride comprising the group-III metal and nitride from the mixed molten liquid and a substance comprising the nitride, and, wherein the liquid holding vessel has an inner shape such as to produce a local concentration distribution of dissolved nitrogen in the mixed molten liquid (as mentioned above in the crystal growth methods).

The above-mentioned unit may include a heating device heating the temperature inside the liquid holding vessel so as to enable the crystal growth therein.

The unit may include a plurality of heating devices for creating a predetermined temperature difference between an upper part and a lower part of the liquid holding vessel independently.

Thus, since the cross sectional area of the vessel becomes smaller downward, and, then, it is uniform from the mid level, or it becomes larger from the mid level, the mixed molten liquid may be held to this zone. Consequently, the group-III metal can be continuously supplied therefrom to a specific zone in which the crystal nucleus is generated, and, thereby, it becomes possible to grow up a large-sized group-III nitride crystal.

Moreover, the group-III nitride crystal thus produced has a high quality (few crystal defects), and also, has a large size such as to be practically utilized for producing a semiconductor device, and such a group-III nitride crystal can be produced at low cost.

Moreover, since it is the semiconductor device produced using the group-III nitride crystal according to the present invention described above, a highly efficient group-III nitride semiconductor device can be offered at low cost.

Furthermore, by producing the group-III nitride semiconductor device using the group-III nitride crystal mentioned above, a highly efficient device is realizable at low cost. As this group-III nitride crystal is a high-quality crystal having few crystal defects, as mentioned above, a highly efficient device is realizable by device production from thin film growth using this group-III nitride crystal, or using it as a substrate of the device. That is, a high output which has not been realized conventionally can be provided and a long life is provided in a case of production of a semiconductor laser or a light emitting diode. In a case of production of an electronic device, low power consumption, low noise, high-speed operation, and high temperature operation are achievable. In a case of light receiving device, low noise and a long life can be obtained.

Moreover, according to the present invention, the semiconductor device may be a light-emission device which emits light of the wavelength shorter than 400 nm, and can emit light at high efficiency also in this wavelength region. That is, since the semiconductor device thus obtained has few crystal defects and few impurities consequently, it becomes possible to realize the efficient light-emission characteristic wherein light emission from a deep level is well controlled.

BRIEF DESCRIPTION OF THE DRAWINGS

Other objects and further features of the present invention will become more apparent from the following detailed description when read in conjunction with the following accompanying drawings.

DETAILED DESCRIPTION OF THE PREFERRED EMBODIMENTS

Hereafter, embodiments of the present invention will now be described with reference to the figures.

The present invention is characterized by preventing alkaline-metal vapor from dispersing out of a first reaction vessel, while a group-III nitride crystal is grown within the first reaction vessel using a mixed molten liquid which contains at least an alkaline metal and a group-III metal and a nitrogen material brought from the outside of the first reaction vessel.

By the crystal growth method according to the present invention, a mixed molten liquid which at least contains an alkaline metal and a group-III metal is present in the first reaction vessel, and temperature control of this first reaction vessel is carried out so that crystal growth can be performed. A nitrogen material is brought from the exterior of this first reaction vessel, then, the alkaline metal, group-III metal, and nitrogen material react, and thus, a crystal of the group-III nitride grows. The nitrogen material means nitrogen molecules, nitrogen atoms, and/or nitrogen molecules and/or nitrogen atoms generated from a compound containing nitrogen.

In a temperature range in which a crystal of the group-III nitride grows, the alkaline metal has a certain vapor pressure. According to the present invention, th thus-generated alkaline-metal vapor is prevented from dispersing out of the first reaction vessel.

In particular, in a first embodiment of the present invention, a zone through which the nitrogen material passes in the first reaction vessel is prevented from being blocked by the alkaline-metal vapor, while a group-III nitride crystal is grown within the first reaction vessel using a mixed molten liquid which contains at least an alkaline metal and a group-III metal, and a nitrogen material brought from the outside of the first reaction vessel.

To prevent the zone through which the nitrogen material passes in the first reaction vessel from being blocked by the alkaline-metal vapor may include not only to prevent the alkaline metal from condensing in this zone but also to remove (mechanically) the alkaline metal condensed there.

In order to prevent condensation of the alkaline metal, when growing the group-III nitride crystal in the first reaction vessel using the mixed molten liquid which contains the alkaline metal and group-III metal, and the nitrogen material brought from the outside of the first reaction vessel, controlling is made such as to prevent the temperature of a portion above the surface of the mixed molten liquid which contains the group-III metal with the alkaline metal from decreasing from the temperature below which the alkaline metal vapor may condense in the first embodiment. In this case, the temperature above the surface of the mixed molten liquid in the first reaction vessel is not to be made lower than the temperature of the mixed molten liquid including the surface of the mixed molten liquid.

Figure 5:
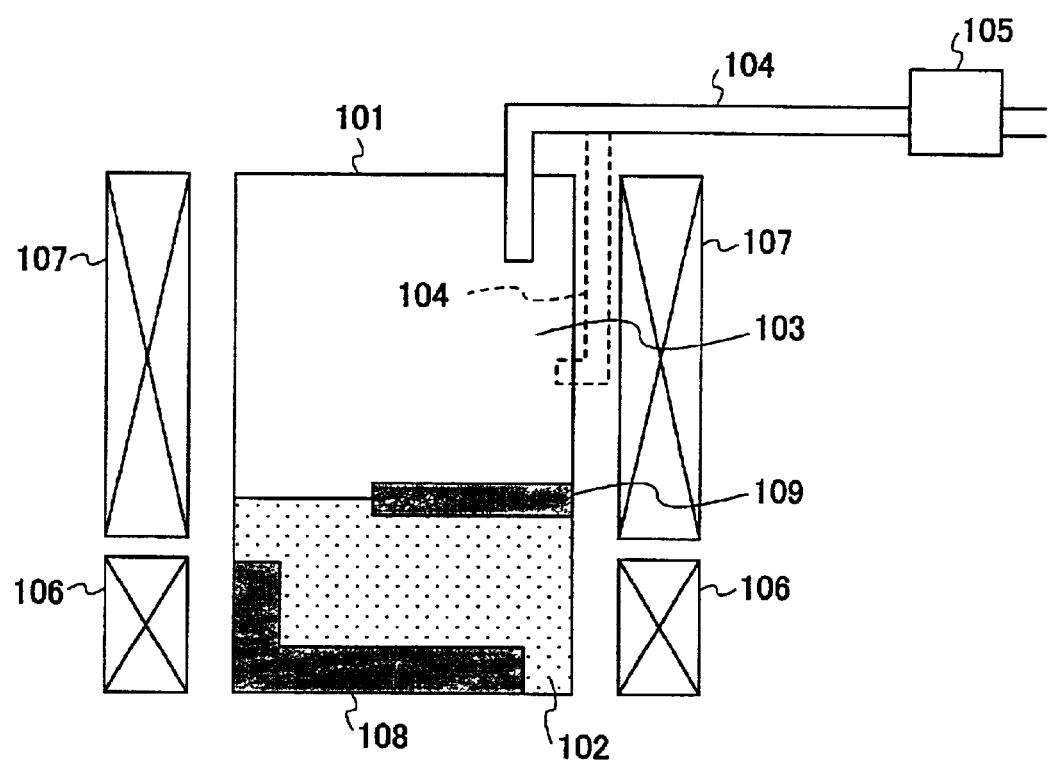
FIG. 5 shows a side-elevational sectional view of a crystal growth apparatus in a first embodiment of the present invention.

FIG. 5 shows a configuration of a crystal growth apparatus in the first embodiment of the present invention. In FIG. 5, in the first reaction vessel 101, Na as the alkaline metal and a metal Ga as a substance which contains a group-III metallic element at least are contained, and they form a mixed molten liquid 102 at the temperature range in which a crystal of the group-III nitride crystal can grow.

There, the first reaction vessel 101 is made of a stainless steel, and, the space zone 103 of the first reaction vessel 101 is filled by a nitrogen gas ($N_2$), as the substance which at least contains a nitrogen element. This nitrogen gas 103 can be supplied through a nitrogen supply pipe 104 from the outside of the first reaction vessel 101. In order to adjust the pressure of the nitrogen gas, a pressure adjustment mechanism 105 is provided. For example, a pressure sensor, a pressure adjustment valve, etc. are included in this pressure adjustment mechanism 105. This pressure adjustment mechanism 105 controls the pressure of the nitrogen gas in the first reaction vessel 101, for example, to 50 atm.

Moreover, in the crystal growth apparatus shown in FIG. 5, a first heating device 106 is provided in the outside of the first reaction vessel 101 in a range of height in which the mixed molten liquid 102 of the alkaline metal Na and group-III metal Ga is held such that the temperature of the mixed molten liquid 102 can be controlled so that a crystal of the group-III nitride can grow inside or the surface of this mixed molten liquid 102.

Furthermore, in the crystal growth apparatus shown in FIG. 5, a second heating device 107 is provided above the first heating device 106 so that the temperature above the surface of mixed molten liquid 102 can be controlled thereby.

Na which is the alkaline metal and Ga which is the group-III metal material can form the mixed molten liquid 102 as a result of control being made by the first heating device 106 into the temperature (for example, 750° C.) in which a crystal of the group-III nitride crystal can grow. There, the temperature of the upper part of the first reaction vessel 101 is controlled by the second heating device 107 so that the temperature above the surface of the mixed molten liquid 102 which includes Na which is the alkaline metal and Ga which is the group-III metal material is not less than the temperature of the mixed molten liquid 102. In this state, a GaN crystal as the group-III nitride is grown in the mixed molten liquid 108 and the surface 109 thereof, as Ga which is the group-III metal is supplied from the mixed molten liquid 102, and the growth temperature is thus maintained.

In the crystal growth apparatus shown in FIG. 5, inside 108 or in the surface 109 of the mixed molten liquid 102 of Na and Ga, a continuous growth of the GaN crystal is performed as the nitrogen gas and Ga react, or the nitrogen ingredient in the molten liquid supplied from the nitrogen gas and Ga react, and thus, it is possible to obtain a large size of the crystal.

Furthermore, in the crystal growth apparatus shown in FIG. 5, condensation of Na in the upper part of the first reaction vessel 101 can be prevented as the temperature of the upper part of the first reaction vessel 101 is controlled by the second heating device 107 so that the temperature above the surface of the mixed molten liquid 102 which includes Na which is the alkaline metal and Ga which is the group-III metal material may be not less than the temperature of the mixed molten liquid 102 itself. That is, since the temperature above the mixed molten liquid 102 is higher than the temperature of the mixed molten liquid 102 itself, condensation of Na in the upper part of the first reaction vessel 101 can be prevented. Consequently, it becomes possible to prevent condensation of Na in the nitrogen supply pipe 104. That is, it is possible to prevent supply of the nitrogen gas from being obstructed by condensation of Na in the nitrogen supply pipe 104. Moreover, the composition of the alkaline metal Na and the group-III metal Ga in the mixed molten liquid 102 is thus hardly changed, and, thus, stable crystal growth is attained. Thus, the alkaline metal (alkaline-metal vapor) Na is prevented from dispersing out of the first reaction vessel 101 by preventing the alkaline-metal vapor from blocking the nitrogen pipe 104 by properly heating the upper part of the reaction vessel 101.

In other words, when the temperature above the surface of the mixed molten liquid 102 were lower than the temperature of the mixed molten liquid 102, condensation of Na onto the inner wall of the first reaction vessel 101 and/or the nitrogen supply pipe 104 might arise. Consequently, the composition of the alkaline metal Na and the group-III metal Ga in the mixed molten liquid 102 might change, or Na blocked the nitrogen supply pipe 104 so that the nitrogen could not be supplied. In order to avoid such a situation, the temperature of the upper part of the reaction vessel 101 is controlled by the second heating device 107 so that the temperature above the surface of the mixed molten liquid 102 should become more than the temperature of the mixed molten liquid 102 itself according to the present invention.

Figure 6:
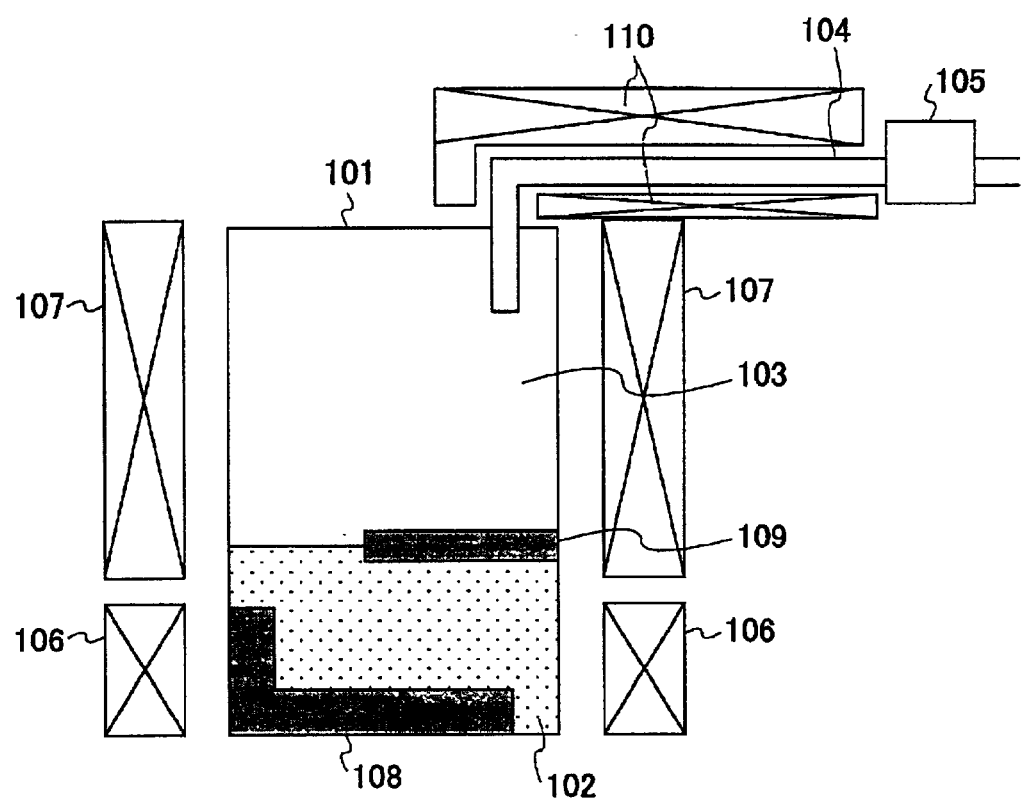
FIG. 6 shows a side-elevational sectional view of a crystal growth apparatus in a second embodiment of the present invention.

Further, in the crystal growth apparatus shown in FIG. 6, temperature control of a more specific zone through which the nitrogen material supplied externally passes into the first reaction vessel 101 may be carried out.

FIG. 6 shows a crystal growth apparatus in a second embodiment of the present invention in which temperature control of a more specific zone through which the nitrogen material supplied externally passes into the first reaction vessel 101 is performed.

That is, in the crystal growth apparatus shown in FIG. 6, in order that temperature control of the zone (in this case, namely, the nitrogen supply pipe 104) through which the nitrogen material supplied externally passes into the first reaction vessel 101, a third heating device 110 is provided in the outside of the nitrogen supply pipe 104.

In the crystal growth apparatus shown in FIG. 6, temperature control of the nitrogen supply pipe 104 is attained by the third heating device 110. That is, as the nitrogen supply pipe 104 is directly heated by the third heating device 110, the alkaline metal can be more positively prevented from condensing in the nitrogen supply pipe 104 more effectively than in the crystal growth apparatus shown in FIG. 5. Consequently, it becomes possible to bring nitrogen much more smoothly into the inside of the reaction vessel 101, and thus, more stable crystal growth can be attained.

Thus, by the crystal growth apparatus shown in FIG. 6, the alkaline metal can be prevented from condensing to the more specific zone (nitrogen supply pipe 104) by heating this zone (nitrogen supply pipe 104) through which the nitrogen material supplied externally passes into the first reaction vessel 101. Although the alkaline metal which adheres to this zone (nitrogen supply pipe 104) may be removed (for example, mechanically) instead of or in addition to preventing condensation of the alkaline metal to the zone (nitrogen supply pipe 104) through which nitrogen material passes as mentioned above, the configuration of the crystal growth apparatus shown in FIG. 6 can perform the same function in a simpler manner in consideration of the configuration of the apparatus. Moreover, even when the alkaline metal condenses to the nitrogen supply pipe 104, it becomes possible to re-evaporate the thus-condensed alkaline metal by heating the above-mentioned zone (nitrogen supply pipe 104), as the temperature of the zone (nitrogen supply pipe 104) through which the nitrogen material supplied externally passes can be controlled by the third heating device 110.

Other than the configurations shown in FIGS. 5 and 6, it is possible to realize the function of preventing the alkaline metal vapor from dispersing out of the first reaction vessel. For example, a second reaction vessel is provided in the outside of the first reaction vessel, the nitrogen material is brought from the outside of the second reaction vessel, and a configuration is provided such that the alkaline metal vapor is prevented from dispersing out of the first reaction vessel while the first reaction vessel causes the nitrogen material supplied from the second reaction vessel to pass inside therethrough.

In such a configuration, the nitrogen material is brought in the second reaction vessel from the outside. The mixed molten liquid which contains at least the alkaline metal and at least the group-III metal is provided in the inside of the first reaction vessel, and the nitrogen material passes inside through the first reaction vessel and thus is brought into the first reaction vessel. Thereby, the alkaline metal, group-III metal and nitrogen material react in the first reaction vessel, and a crystal of the group-III nitride grows. In the temperature range in which a crystal of the group-III nitride grows, the alkaline metal has a certain vapor pressure, and the thus-generated alkaline metal vapor is prevented from dispersing out of the first reaction vessel.

Figure 7:
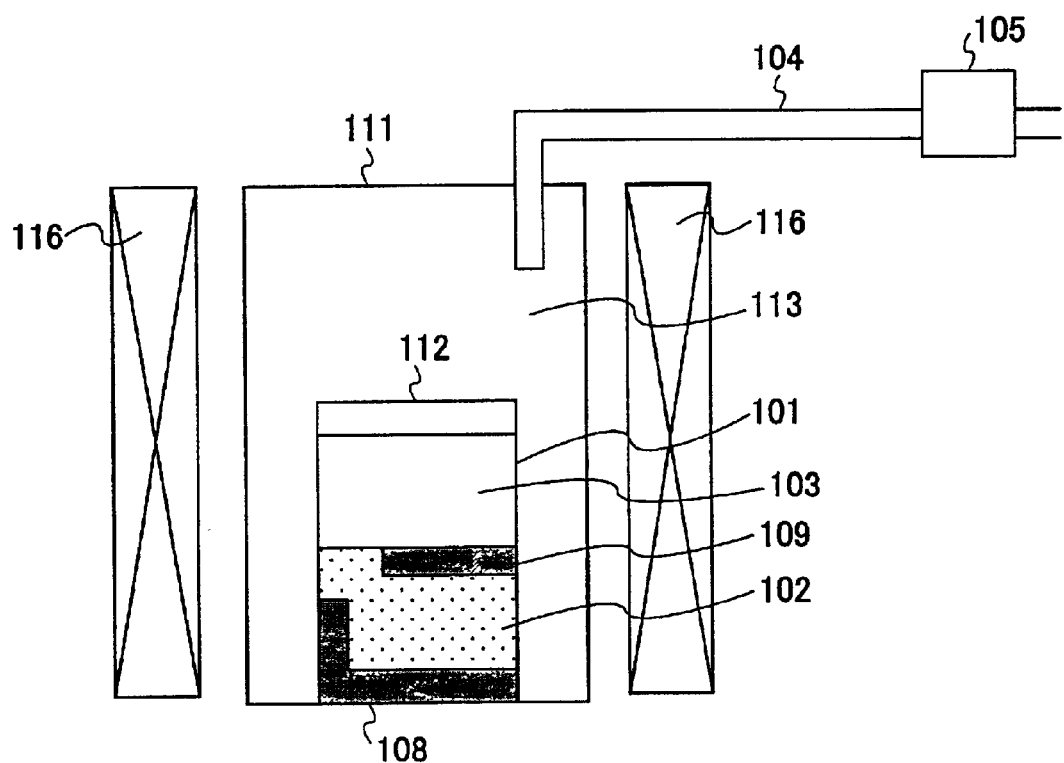
FIG. 7 shows a side-elevational sectional view of a crystal growth apparatus in a third embodiment of the present invention.

FIG. 7 shows a crystal growth apparatus in a third embodiment of the present invention. In this configuration, a second reaction vessel 111 is provided outside of a first reaction vessel 101, the nitrogen material (in a form of gas) is supplied from the outside of the second reaction vessel 111, the first reaction vessel 101 has a configuration such as to prevent the alkaline metal vapor from dispersing out of the first reaction vessel 101, while causes the nitrogen material provided from the second reaction vessel 111 to pass therethrough into the inside of the first reaction vessel 101. That is, in the crystal growth apparatus shown in FIG. 7, the second reaction vessel 111 is in the outside of the first reaction vessel 101.

For the above-mentioned purpose, in the configuration of FIG. 7, a lid 112 is provided in the upper part of the first reaction vessel 101. There, the material of the first reaction vessel 101 is BN (boron nitride), and the second reaction vessel 111 is made of stainless steel.

In the first reaction vessel 101, Na as the alkaline metal, and, a metal Ga as a substance at least containing the group-III metallic element is contained. They form a mixed molten liquid 102 in the temperature range in which a crystal of the group-III nitride grows. The space zone 103 in the first reaction vessel 101 and the space zone 113 in the second reaction vessel 111 are filled by the nitrogen gas ($N_2$) as a substance which at least contains a nitrogen element. This nitrogen gas can pass through the nitrogen supply pipe 104 pass, and thus can be supplied into the second reaction vessel 111 externally. Furthermore, there is a fine crevice between the first reaction vessel 101 and the lid 112 such as to allow the nitrogen gas to pass therethrough and thus to be supplied into the first reaction vessel 101 from the second reaction vessel 111.

In addition, in order to adjust the nitrogen pressure, a pressure adjustment mechanism 105 is provided in the apparatus shown in FIG. 7. This mechanism includes, for example, a pressure sensor, a pressure adjustment valve, etc., and this pressure adjustment mechanism 105 controls the nitrogen pressure in the second reaction vessel 111 and the first reaction vessel 101 into 50 atm., for example.

In the crystal growth apparatus shown in FIG. 7, a heating device 116 is provided outside of the second reaction vessel 111 such that the temperature inside of or in the surface of the mixed molten liquid 102 in the first reaction vessel 101 can be controlled so that a crystal of the group-III nitride can grow therein.

The mixed molten liquid 102 of Na which is the alkaline metal, and Ga which is the group-III metal material is formed by performing temperature control aiming at the temperature (for example, 750° C.) at which a crystal of the group-III nitride can grow. In this state, a GaN crystal as a group-III nitride can grow in the mixed molten liquid 108 and in the surface of the mixed molten liquid 109 as Ga which is the group-III metal is supplied by the mixed molten liquid, and the above-mentioned growth temperature is maintained.

In the crystal growth apparatus shown in FIG. 7, in the mixture molten liquid of Na and Ga 108, and in the surface thereof 109, continuous growth of the GaN crystal is achieved as the nitrogen gas and Ga react or the nitrogen ingredient in the molten liquid supplied from nitrogen gas and Ga react, and, thus, it becomes possible to obtain a large size of the crystal.

Furthermore, in the crystal growth apparatus shown in FIG. 7, the alkaline metal can be prevented from dispersing out of the first reaction vessel 101 almost completely as the first reaction vessel 101 is provided with the lid 112. Thereby, change in the composition of the alkaline metal and group-III metal is well controlled, and it becomes possible to grow the group-III nitride crystal with well controlled condition. At this time, condensation of the alkaline metal into the nitrogen supply pipe 104 can also be controlled (avoided).

Moreover, in controlling the temperature in the first reaction vessel 101 so that the temperature above the surface of the mixed molten liquid 102 which consists of Na which is the alkaline metal, and Ga which is the group-III metal material becomes more than the temperature of the mixed molten liquid 102 itself as described above for the crystal growth apparatus shown in FIG. 5, it becomes possible to prevent dispersion of the alkaline metal occurring due to condensation thereof in the supply pipe or the like externally from the mixed molten liquid 102 more positively.

Moreover, in any of the configurations of the crystal growth apparatus shown in FIGS. 5, 6 and 7, the nitrogen material may instead be brought into the reaction vessel 101 or 111 horizontally of the first reaction vessel or second reaction vessel 111, or from a direction below the horizontal direction thereof.

Figure 8:
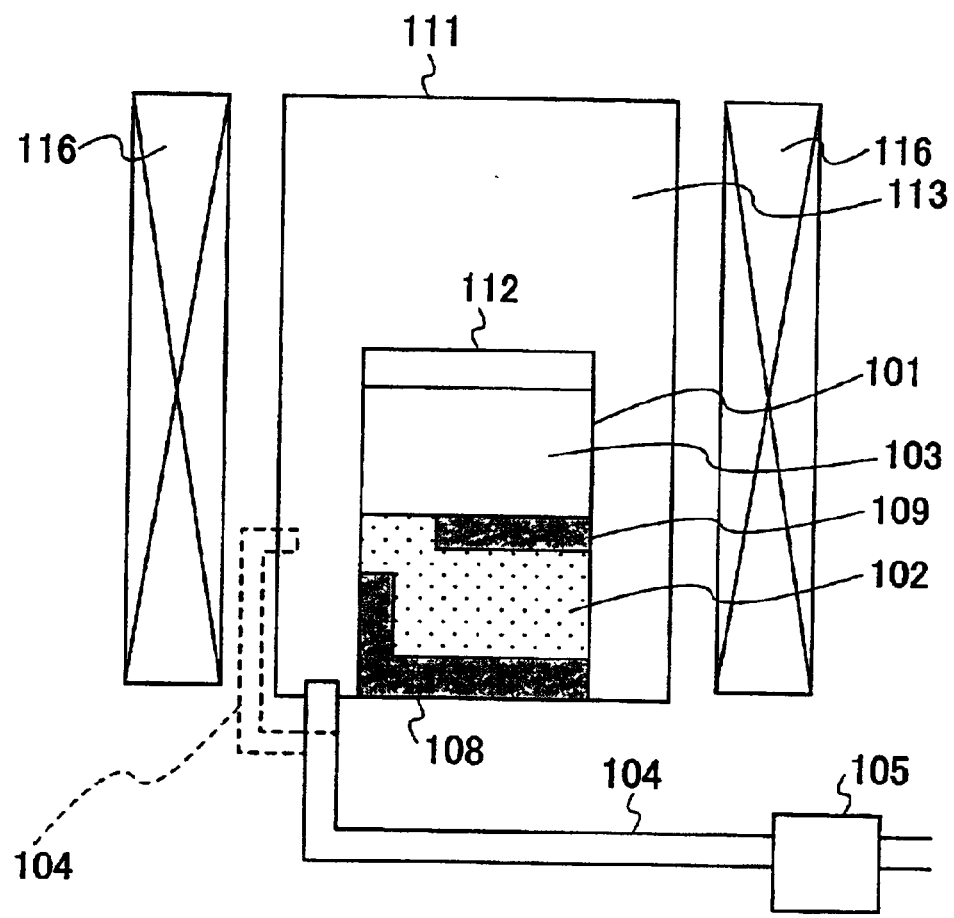
FIG. 8 shows a side-elevational sectional view of a crystal growth apparatus in a fourth embodiment of the present invention.

FIG. 8 shows a crystal growth apparatus in a fourth embodiment of the present invention. In this configuration, the nitrogen supply pipe 104 is connected to the second reaction vessel 111 at the bottom of the crystal growth apparatus, as shown in the figure. Therefore, the nitrogen gas which is a nitrogen material is supplied from the bottom of the second reaction vessel 111. The inventor of the present invention confirmed experimentally that an alkaline metal in a form of vapor was more likely to condense in an upper part of a reaction vessel than in a lower part thereof. Therefore, the nitrogen supply pipe 104 can be more positively prevented from being blocked by the alkaline metal and can bring the nitrogen gas toward the mixed molten liquid more positively, as the nitrogen is supplied from the bottom as in the crystal growth apparatus shown in FIG. 8. Consequently, it becomes possible to ensure bringing (provision) of the nitrogen gas into the mixed molten liquid, and, thereby, the control (control of the nitrogen pressure) of crystal growth can be performed more positively.

In addition, in the example of FIG. 8, although the nitrogen gas is brought inside from the bottom of the second reaction vessel 111, an embodiment of the present invention is not limited thereto, and similar effect can be obtained as long as the nitrogen gas is brought inside from a horizontal direction (as indicated by a broken line 104' in FIG. 8) or from a direction lower than the horizontal direction of the second reaction vessel 111.

Moreover, although the crystal growth apparatus shown in FIG. 8 is an example corresponding to the embodiment shown in FIG. 7, an example corresponding to any of the configurations shown in FIGS. 5 and 6 can be embodied in the same manner. That is, the nitrogen gas may be brought horizontally into the first reaction vessel 101 or second reaction vessel 111, or in a direction below the horizontal direction thereinto, there (as indicated by a broken line 104' in FIG. 5).

In addition, in the above-described embodiments, although Na is used as a metal (alkaline metal) having a low melting point and a high vapor pressure, potassium (K) etc. can also be used instead of Na. That is, any alkaline metal may be used as long as, in the temperature range in which a crystal of a group-III nitride can grow, it is in a form of a molten liquid.

Moreover, in the above-described embodiments, at least, as a substance at least containing a group-III metallic element, Ga is used. However, another metal such as Al or In, a mixture thereof or an alloy thereof may be used instead.

Moreover, although a nitrogen gas is used in the above-described embodiments as a substance which at least contains a nitrogen element, another gas, such as $NH_3$, may also be used instead of the nitrogen gas.

Moreover, although the first reaction vessel 101 is made of stainless steel in the above-described embodiments, any material can be used as the material of the first reaction vessel instead as long as it can form a closed space separate from the exterior atmosphere, and resists the temperature and pressure needed for growing a group-III nitride crystal, and, also, does not react with the alkaline metal, and thus is not melted as an impurity when the group-III nitride crystal grows.

By employing the crystal growth apparatus in any of the above-described first, second, third and fourth embodiments shown in FIGS. 5, 6, 7 and 8, for growing a group-III nitride crystal, such a large-sized group-III nitride crystal as that can be put into practice in manufacture of semiconductor device can be obtained at low cost.

As an example of a method of growing a group-III nitride crystal according to the present invention, Ga is used as a group-III metal, a nitrogen gas is used as a nitrogen material, Na is used as a flux, the temperature of the reaction vessel and flux vessel is made into 750° C., and the nitrogen pressure is fixed into 50 kg/cm². Thereby, a GaN crystal can grow.

Moreover, by using a group-III nitride crystal thus grown up by the growth method according to the present invention, a group-III nitride semiconductor device can be produced.

Figure 9:
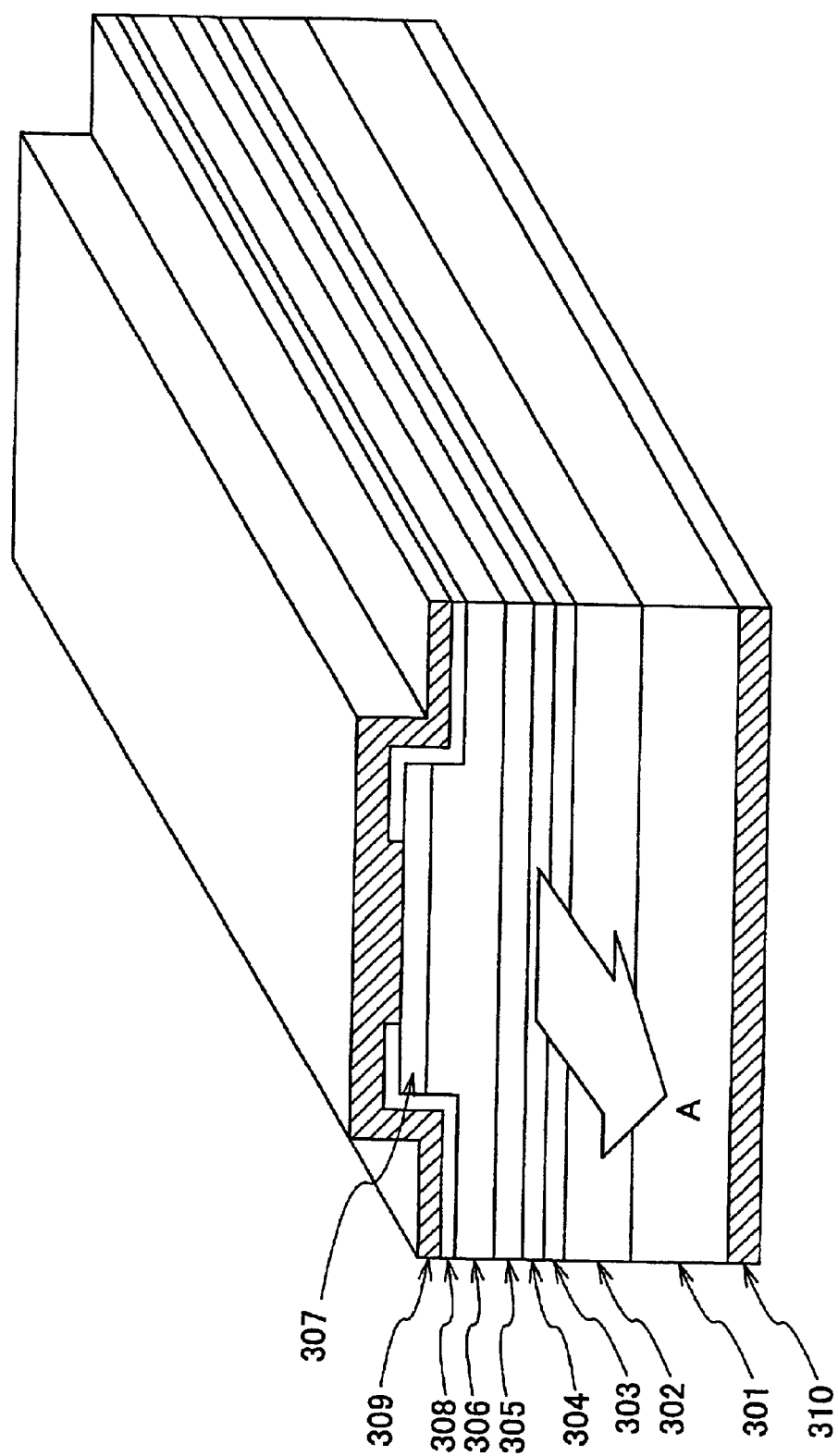
FIG. 9 shows a perspective view of one example of a semiconductor laser to which a group-III nitride semiconductor device according to the present invention is applied.

FIG. 9 shows an example of configuration of such a semiconductor device according to the present invention. The semiconductor device shown in FIG. 9 is in a form of a semiconductor laser. As shown in the figure, in this semiconductor device, on an n-type GaN substrate 301 using a group-III nitride crystal produced according to the above-described crystal growth method according to the present invention, an n-type AlGaN clad layer 302, an n-type GaN guide layer 303, an InGaN MQW (multiple quantum well) activity layer 304, a p-type GaN guide layer 305, a p-type AlGaN clad layer 306, and a p-type GaN contact layer 307 are formed one by one through crystal growth processes. As the crystal growth method therefor, a thin film crystal growth method, such as an MO-VPE (organometallic vapor phase epitaxy) method, an MBE (molecular beam epitaxy) method, or the like may be used.

Subsequently, a ridge structure is formed in the laminated films of GaN, AlGaN, and InGaN, $SiO_2$ insulating layer 308 is formed only with a hole formed as a contact region, a p-side ohmic electrode Au/Ni 309, and an n-side ohmic electrode Al/Ti 310 are respectively formed on top and bottom thereof, and thus, a semiconductor device (semiconductor laser) shown in FIG. 9 is formed.

By injecting an electric current from the p-side ohmic electrode Au/Ni 309 and n-side ohmic electrode Al/Ti 310 of this semiconductor laser, it oscillates, and emits laser light in a direction of an arrow A shown in FIG. 9.

Figure 1:
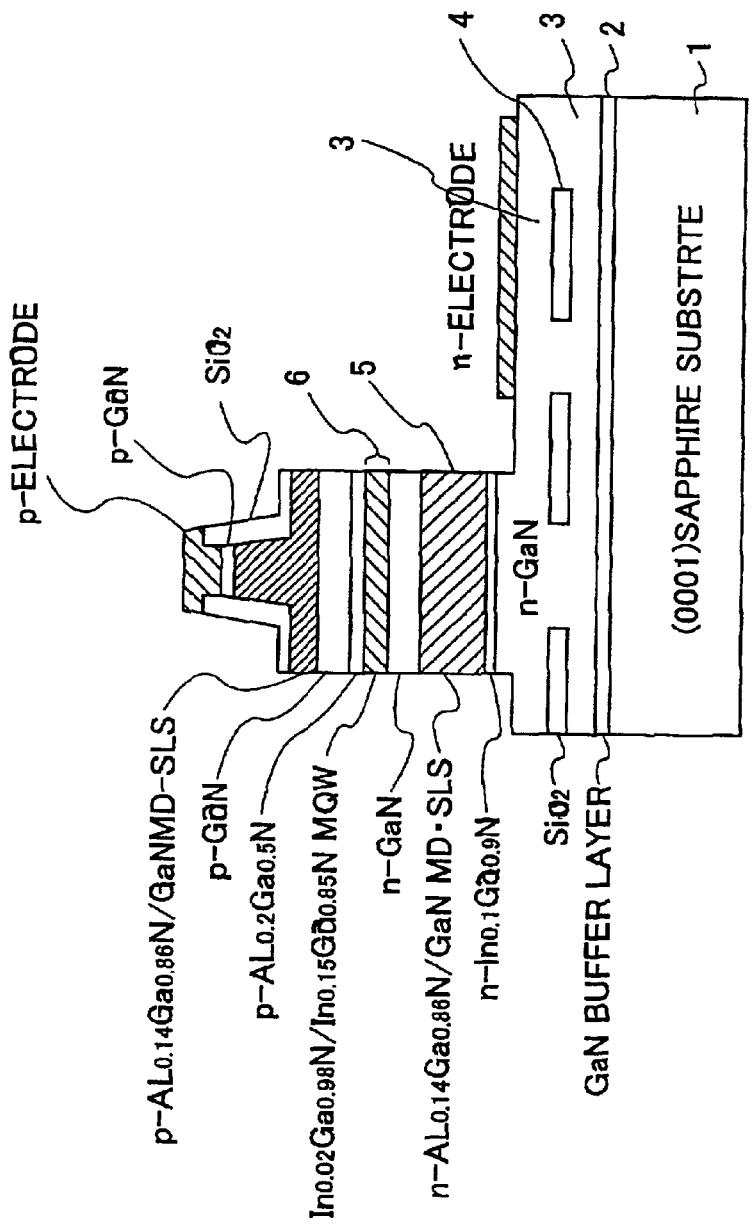
FIG. 1 shows a side-elevational sectional view of a semiconductor laser in the first prior art.
Figure 2:
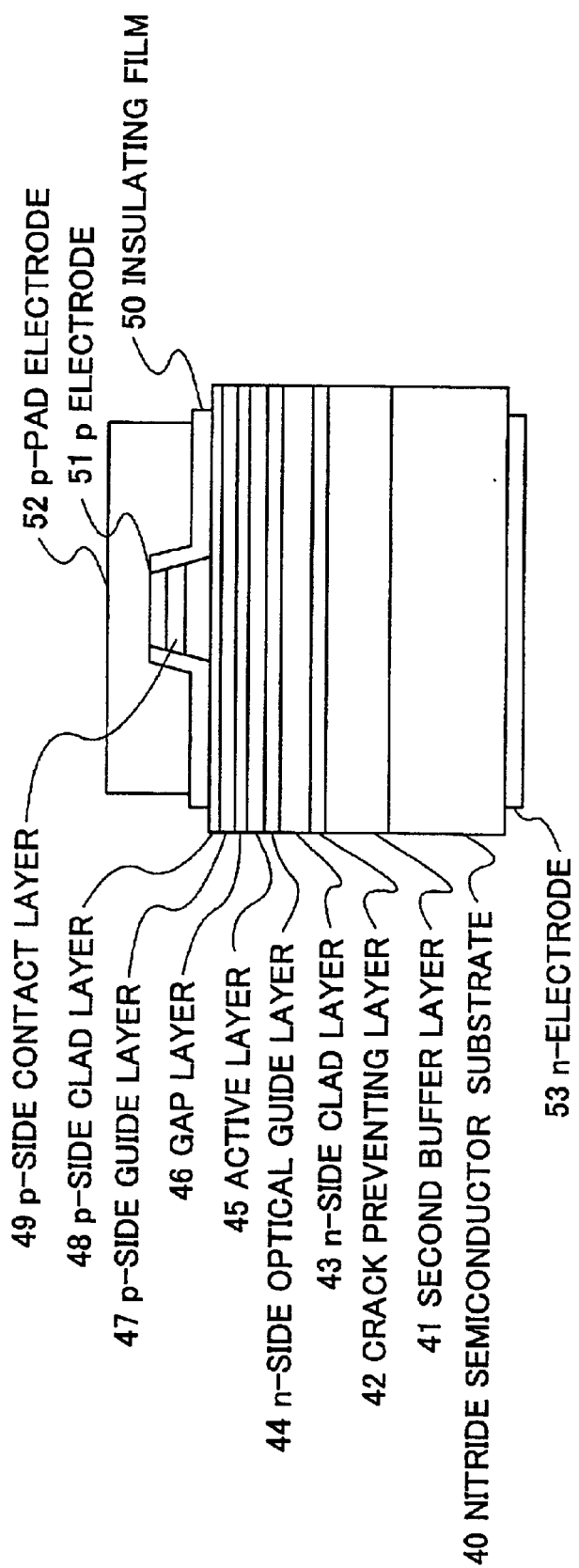
FIG. 2 shows a side-elevational sectional view of a semiconductor laser in the second prior art.
Figure 3A:
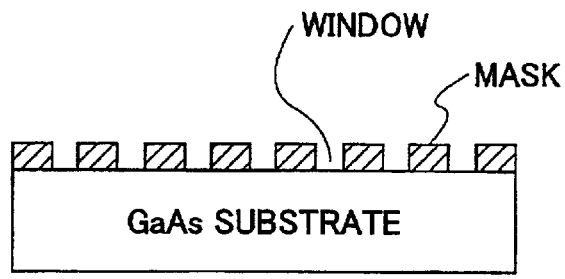
FIGS. 3A through 3D and 4A through 4C illustrate the sixth prior art.
Figure 3B:
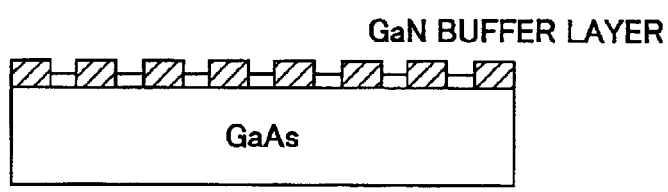
Figure 3C:
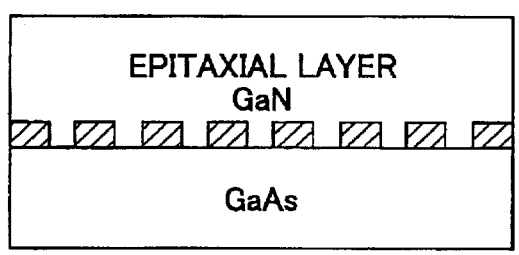
Figure 3D:
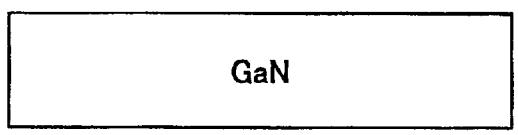
Figure 4A:
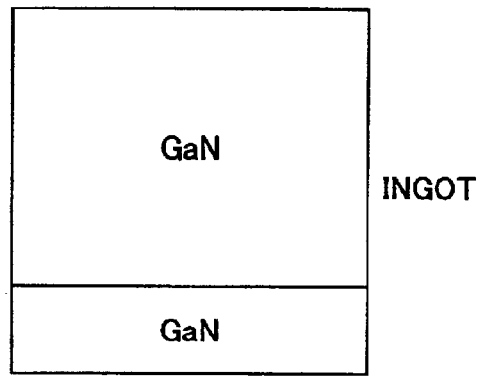
Figure 4B:
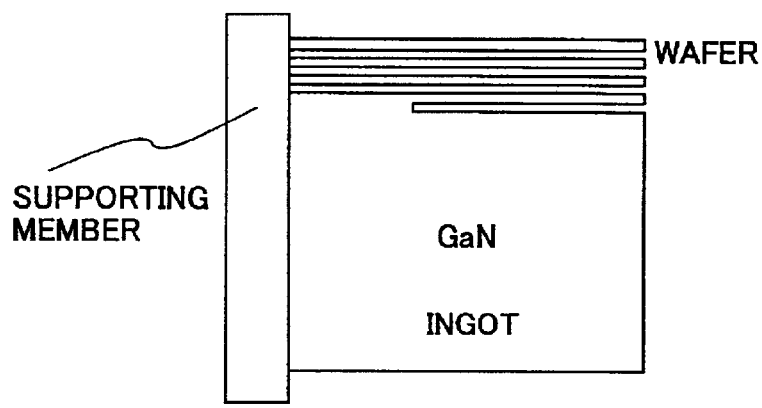
Figure 4C:
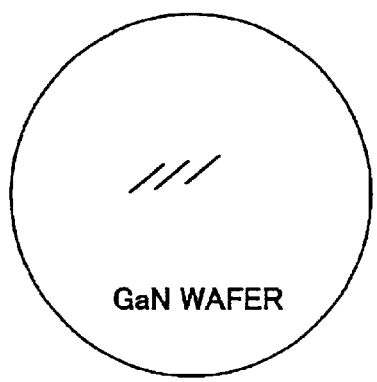

Since the group-III nitride crystal (GaN crystal) according to the present invention is used in this semiconductor laser as the substrate 301, there are few crystal defects in the semiconductor laser device, and it provides a large power output and has a long life. Moreover, since the GaN substrate 301 is of n type, an electrode 310 can be formed directly onto the substrate 301, thus does not need to draw two electrodes of p side and n side only from the obverse surface as in the prior art shown in FIG. 1, and, thus, cost reduction can be achieved.

Furthermore, in the semiconductor device shown in FIG. 9, it becomes possible to form a light emitting end surface by cleavage, also, chip separation can be performed by cleavage. Thus, it is possible to achieve a high-quality semiconductor device at low cost.

With reference to FIGS. 10 through 15, a crystal growth method in a fifth embodiment and variant embodiments thereof, of the present invention for growing a group-III nitride crystal will now be described.

(First Feature of the Fifth Embodiment of the Present Invention)

In the crystal growth method in the fifth embodiment of the present invention, a crystal of a group-III nitride including a group-III metal and nitrogen is grown in a reaction vessel from an alkaline metal, a substance at least containing the group-III metal, and a substance at least containing the nitrogen. In particular, a growth process is made such that a growth condition is set in which the crystal growth stops after a growth condition is set by which a group-III nitride crystal starts growing, and, then, the growth condition is set by which the crystal growth starts, again.

The alkaline metal, the substance which at least contains the group-III metal, and the substance which at least contains the nitrogen are present in the reaction vessel. They may be supplied externally, or may be present in the reaction vessel originally. This reaction vessel is provided with a temperature control mechanism and a pressure control mechanism, and, thereby, it is possible arbitrarily to raise the temperature in the reaction vessel so as to enable crystal growth therein, raise the pressure in the reaction vessel so as to enable crystal growth therein, lower the temperature in the reaction vessel so as to stop the crystal growth, to lower the pressure in the reaction vessel so as to stop the crystal growth, and to maintain temperature/pressure in the reaction vessel for a desired time interval.

Then, by setting the temperature in the reaction vessel so as to cause it to satisfy the growth condition by which the group-III nitride crystal can grow, crystal growth of the group-III nitride begins. Immediately after the crystal growth of the group-III nitride begins and thus nucleus generation starts, the condition in the reaction vessel is made to enter a condition by which the crystal growth stops, and thus the nucleus generating stops. Next, by returning the temperature of the reaction vessel to the condition by which the crystal growth starts again, the crystal growth of the group-III nitride progresses utilizing the nucleus generated before as a seed crystal.

The nitrogen material used the embodiment according to the present invention is a nitrogen molecule, a nitrogen in a form of atom and/or a nitrogen molecule, and/or a nitrogen molecule and/or a nitrogen in a form of atom generated from a compound containing nitrogen.

(Second Feature of the Fifth Embodiment of the Present Invention)

In addition to the above-described first feature, after setting and maintaining the temperature by which the crystal growth starts in a zone in the reaction vessel in which the crystal of the group-III nitride grows, the temperature in the reaction vessel is lowered so that the crystal growth stops and also the group-III metal and other metal do not form an alloy, and the thus-lowered temperature is maintained. Then, after that, the temperature in the reaction vessel is raised to the temperature at which the crystal growth starts again.

An alkaline metal, a substance which at least contains a group-III metal, and a substance which at least contains a nitrogen are provided in the reaction vessel. They may be supplied externally or may be provided in the reaction vessel originally. This reaction vessel is provided with a unit for performing a temperature control function, and, thereby, the temperature in the reaction vessel is raised so that crystal growth may occur, is lowered so that the crystal growth may stop, or the temperature in the reaction vessel may be maintained for a desired time interval.

By raising the temperature in the reaction vessel so that the group-III nitride crystal may grow, crystal growth of the group-III nitride begins. The nucleus generation stops by then lowering the temperature in the reaction vessel so that the crystal growth stops, immediately after the crystal growth of the group-III nitride begins and nucleus generation starts. Next, by raising the temperature in the reaction vessel so that the crystal growth may start again, the crystal growth of the group-III nitride progresses by utilizing the nucleus generated before as a seed crystal.

(Third Feature of the Fifth Embodiment of the Present Invention)

In addition to the above-described second feature, the increase and decrease of the temperature (growth temperature) in the reaction vessel are repeated. Thereby, crystal growth of the group-III nitride progresses by utilizing the crystal nucleus which has been finally generated as a seed crystal.

(Fourth Feature of the Fifth Embodiment of the Present Invention)

In addition to any one of the above-described second feature and third feature, the substance which at least contains nitrogen is in a form of a gas, and a gas pressure of the gas is maintained during the crystal growth.

Figure 10:
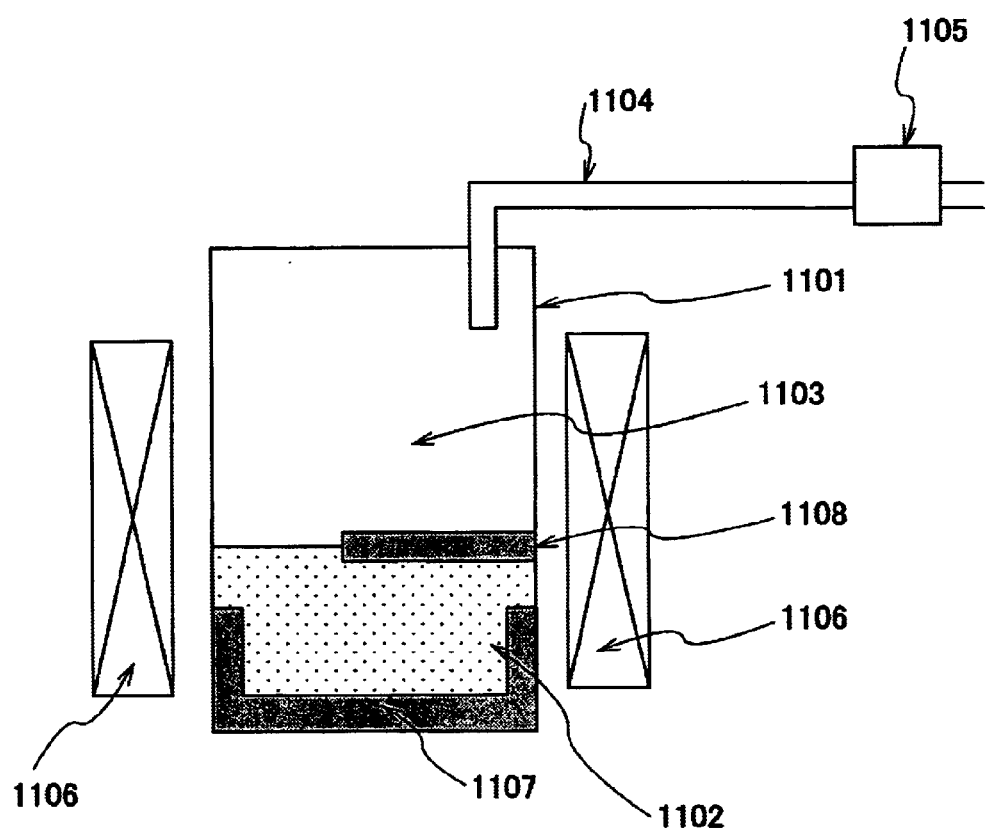
FIG. 10 shows a side-elevational sectional view of a crystal growth apparatus in a fifth embodiment of the present invention.
Figure 11:
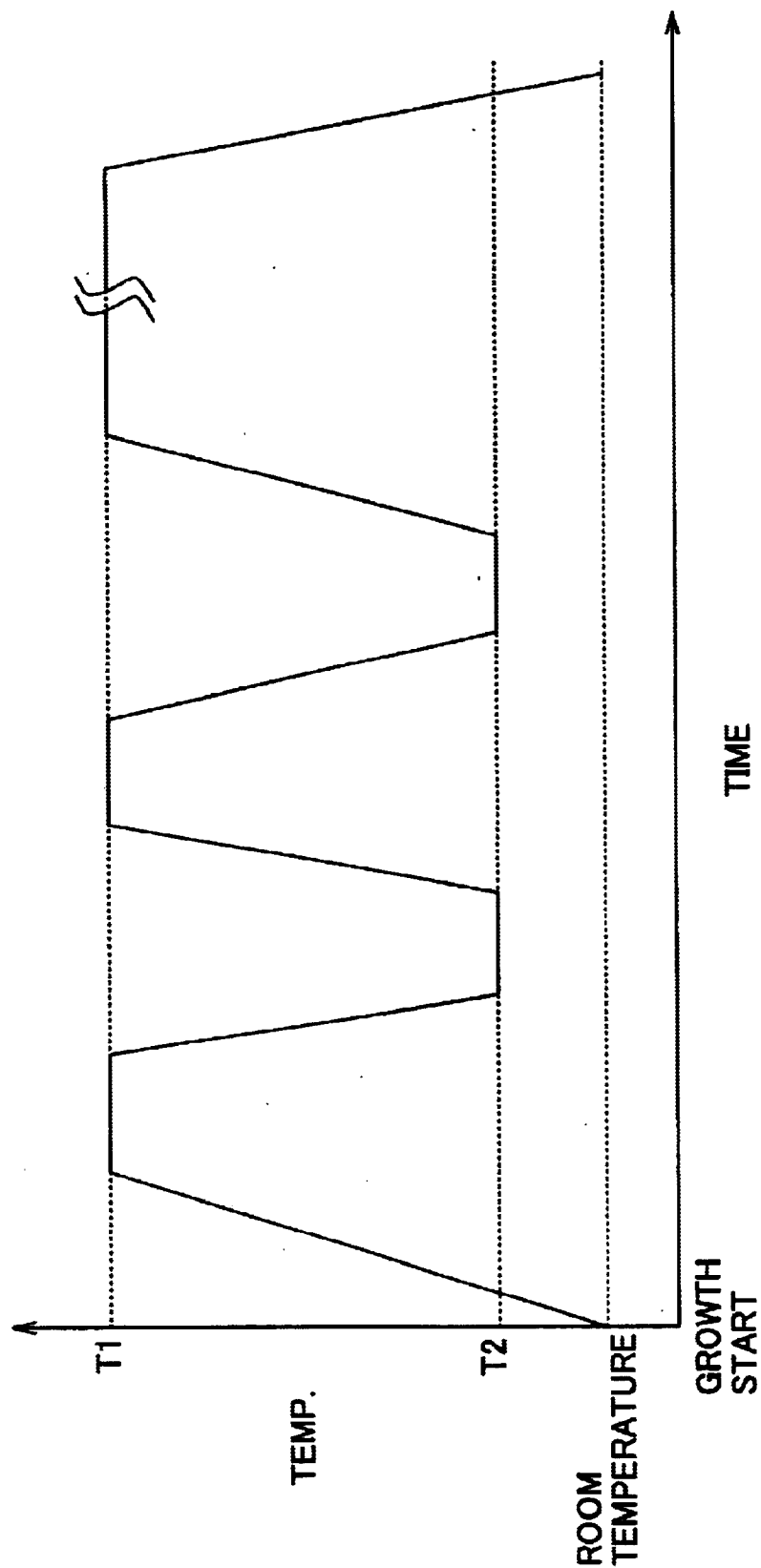
FIG. 11 illustrates a temperature control sequence in the fifth embodiment of the present invention.

The fifth embodiment of the present invention including the above-described second, third and fourth features will now be described with reference to FIGS. 10 and 11. FIG. 10 shows a configuration of a crystal growth apparatus in the fifth embodiment of the present invention. FIG. 11 shows a temperature control sequence for the reaction vessel in the fifth embodiment.

A mixed molten liquid 1102 of Ga as the group-III metal and Na as the flux is provided in the reaction vessel 1101, shown in FIG. 10. In the reaction vessel 1101, a heating device 1106 is provided such that the temperature in the reaction vessel 1101 is controlled so that crystal growth may occur. A nitrogen gas is used as the nitrogen material. The nitrogen gas is supplied through a nitrogen supply pipe 1104 into a space 1103 in the reaction vessel 1101 from the outside of the reaction vessel 1101. In order to adjust the nitrogen pressure at this time, a pressure adjustment mechanism 1105 is provided. This pressure adjustment mechanism 1105 includes a pressure sensor, a pressure adjustment valve, etc. In this apparatus, a state by which the nitrogen gas is supplied to the reaction vessel at a fixed pressure can be maintained thereby.

Under such a condition, the temperature in the reaction vessel is caused to increase to a temperature T1 (for example, 750° C.) by which the crystal growth starts in a first process, as shown in a FIG. 11. Then, this condition is maintained for a predetermined time interval (for example, 30 minutes). Thereby, a nucleus of a GaN crystal which is a group-III nitride is generated in the reaction vessel 1101 shown in FIG. 10. Next, the temperature in the reaction vessel 1101 is lowered to a temperature T2 (for example, 400 degrees C.) at which the crystal growth stops. Next, the temperature in the reaction vessel 1101 is caused to increase to the temperature T1 by which the crystal growth starts again, and this condition is maintained for 30 minutes, and, then, the temperature in the reaction vessel 1101 is again lowered to the temperature T2. A nucleus of the GaN crystal is again generated at the time of this temperature increase.

Then, the temperature in the reaction vessel 1101 is again increased to T1, and this temperature is maintained for a time such that a required crystal size may be obtained. At this time, the crystal growth progresses by utilizing the nucleus generated at the first two times of temperature increase, the GaN crystal becomes larger, and the GaN crystals 1107 and 1108 grow on the wall of the reaction vessel 1101 and near a gas-liquid interface between the mixed molten liquid 1102 of Ga and Na and the space 1103 in the reaction vessel, as shown in FIG. 10.

When a case where the temperature increase and decrease for controlling nucleus generation were performed according to the present invention and a case where such temperature control was not performed as in the prior art were experimentally compared, it was seen that, in the case of controlling the temperature according to the present invention, nucleus generation could be controlled remarkably, and, thus, it became possible to obtain a large-sized crystal, and, thereby, the GaN crystal which could be used more practicality was obtained.

In this fifth embodiment of the present invention, although a temperature rise of the reaction vessel for nucleus generation sake, and temperature descent are repeated twice, it is effective even by performing only once the same. However, it becomes possible to generate a preferential crystal nucleus by performing the repetition. In addition, the nitrogen pressure at this time is 50 atm., and is remarkably low as compared with the pressure in the super-high-pressure method as in the above-mentioned second prior art.
(Fifth Feature of the Fifth Embodiment of the Present Invention)

In addition to the above-described fourth feature, additional supply of the substance which at least contains the group-III metal is made at the time the temperature is low.

Figure 12:
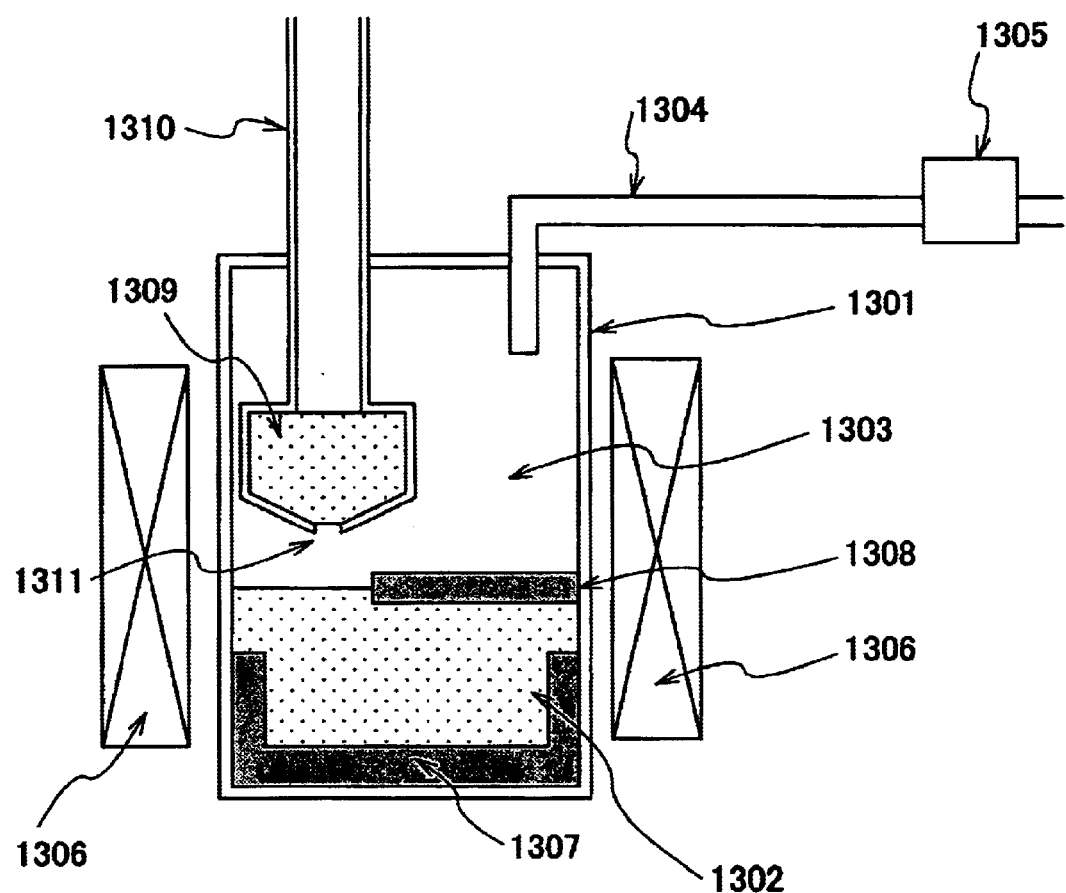
FIG. 12 shows a side-elevational sectional view of a crystal growth apparatus in a first variant embodiment of the fifth embodiment of the present invention.

A first variant embodiment of the above-described fifth embodiment of the present invention will now be described with reference to FIGS. 12 and 13. FIG. 12 shows a elevational sectional view of a crystal growth apparatus in the first variant embodiment of the fifth embodiment of the present invention, and FIG. 13 shows a temperature control sequence for the reaction vessel of the apparatus shown in FIG. 12.

In addition to the configuration shown in FIG. 10, a unit of performing the additional supply of the group-III metal is provided in the configuration as shown in FIG. 12. Only the unit which carries out the additional supply of the group-III metal is the difference from the configuration shown in FIG. 10 and will now be described.

A metal Ga is used as the group-III metal, and in order to carry out the additional supply of the metal Ga, a group-III metal supply pipe 1310 is provided. At an projection end of the group-III metal supply pipe 1310, the metal Ga 1309 for the additional supply is held in a form of powder. This inner projection end of this the group-III metal supply pipe 310 has a hole 1311. The opposite outer end of the group-III metal supply pipe 1310 projects out of the reaction vessel 1301, and, by applying a nitrogen pressure from this end, the metal Ga 1309 at the inner end of the group-III metal supply pipe 310 is supplied to the mixed molten liquid 1302 through the hole 1311.

Figure 13:
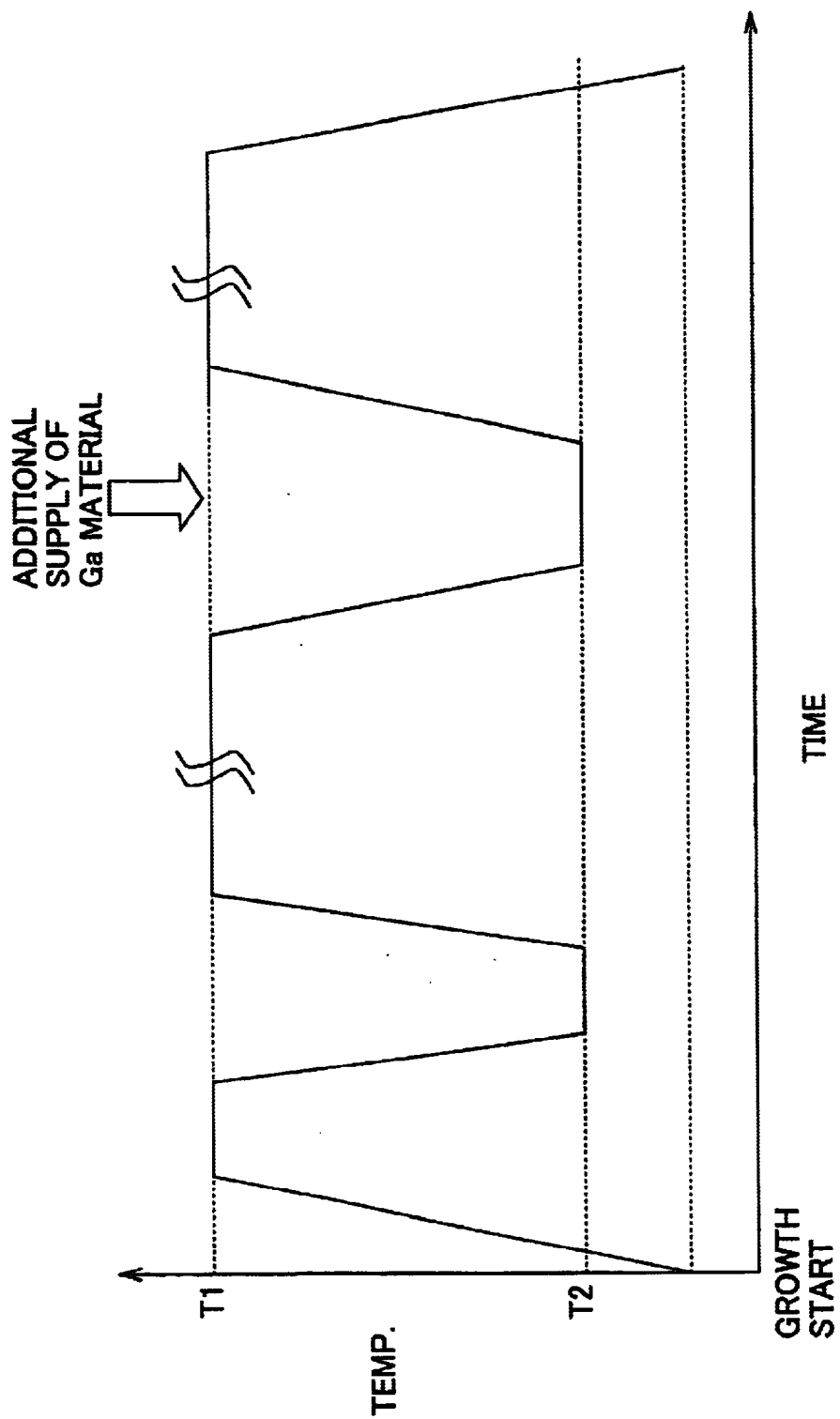
FIG. 13 illustrates a temperature control sequence in the first variant embodiment of the fifth embodiment of the present invention.

In this configuration, the temperature in the reaction vessel 1301 is increased to the temperature T1 (for example, 750° C.) at which the crystal growth starts at a first process as shown in FIG. 13. Then, this state is maintained for a predetermined time interval (for example, 30 minutes), thereby, a nucleus of a GaN crystal which is the group-III nitride is generated in the reaction vessel 1301 shown in FIG. 12. Next, the temperature in the reaction vessel 1301 is lowered to the temperature T2 (for example, 400 degrees C.) at which the crystal growth stops. Then, the temperature in the reaction vessel 1301 is increased to T1 again, and this temperature is maintained for a time interval such that a certain crystal size is obtained. At this time, the crystal growth progresses utilizing the nucleus generated at the time of the first temperature increase, the GaN crystal becomes larger, and the GaN crystal 1307 and the GaN crystal 1308 grow on the wall of the reaction vessel 1301 and near the gas-liquid interface between the mixed molten liquid 1302 of Ga and Na and the space 1303 in the reaction vessel 1301.

As mentioned above, the nitrogen gas which is the nitrogen material can be supplied to the reaction vessel 1301 from the outside continuously at the fixed pressure, and, thereby, the nitrogen is not exhausted. However, Ga which is the group-III metal material may be exhausted as the GaN crystal grows, or, the ratio with Na which is the flux may be changed even when the exhaustion does not actually occur. Thereby, a growth parameter may be changed gradually, the crystal quality may be changed, and, thus, it may become difficult to maintain stable crystal growth.

Then, after the crystal growth progresses to some extent, the temperature in the reaction vessel 1301 is lowered to a temperature at which the crystal growth stops, and, thus, it becomes possible to control the quantity ratio of the group-III metal and Na flux by carrying out the additional supply of the Ga metal, as shown in FIG. 13. Consequently, stable growth of the GaN crystal is attained, and it becomes possible to obtain the high-quality crystal having few defects.

Furthermore, fluctuation in the crystal growth can be well controlled by carrying out additional supply of the Ga at a timing at which the crystal growth does not progress (temperature is low), and it becomes possible to grow up a high-quality GaN crystal.
(Sixth Feature of the Fifth Embodiment of the Present Invention)

In addition to the above-described first feature, the substance which at least contains nitrogen is in a form of a gas, after setting and maintaining the effective nitrogen pressure in a zone where the group-III nitride crystal grows to a pressure at which crystal growth starts, the effective nitrogen pressure is then lowered to a pressure at which the crystal growth stops, and the thus-lowered pressure is maintained. Then, after that, the above-mentioned effective nitrogen pressure is increased to the effective nitrogen pressure at which the crystal growth starts again.

The alkaline metal, the substance which at least contains the group-III metal, and the substance which at least contains the nitrogen are provided in the reaction vessel. They may be supplied from the outside or may be provided in the reaction vessel originally.

A pressure control mechanism (1105 shown in FIG. 10) is provided in this reaction vessel, and, thereby, raising the effective nitrogen pressure to the pressure at which crystal growth may occur, lowering the pressure to a pressure at which the crystal growth may stop, and maintaining each pressure for a desired time interval can be performed.

In this configuration, by raising the effective nitrogen pressure in the reaction vessel to the pressure at which the group-III nitride crystal may grow, crystal growth of the group-III nitride begins. Then, the crystal-nucleus generation stops by lowering the effective nitrogen pressure in the reaction vessel to the pressure at which the crystal growth stops immediately after the crystal growth of the group-III nitride begins and thus crystal nucleus generation starts. Next, by raising the effective nitrogen pressure in the reaction vessel to the pressure at which the crystal growth starts again, crystal growth of the group-III nitride progresses by utilizing the nucleus generated before as a seed crystal.

(Seventh Feature of the Fifth Embodiment of the Present Invention)

In addition to the above-described sixth feature, increase and decrease of the effective nitrogen pressure are performed several times.

By repeating the increase and decrease of the effective nitrogen pressure according to the above-described sixth feature, crystal growth of the group-III nitride progresses by utilizing the crystal nucleus which has been finally obtained by the nucleus generation as a seed crystal.

A second variant embodiment of the fifth embodiment having the above-described sixth and seventh features will now be described with reference to FIG. 14. In this variant embodiment, the crystal growth apparatus shown in FIG. 10 is used.

The mixed molten liquid 1102 of Ga as the group-III metal and Na as the flux is provided in the reaction vessel 1101. In the reaction vessel 1101, a heating device 1106 is provided so that it can control the temperature in the reaction vessel 1101 to the temperature at which crystal growth may occur. Nitrogen gas is used as the nitrogen material. The nitrogen gas is supplied through a nitrogen supply pipe 1104, and is supplied to a space 1103 in the reaction vessel 1101 from the outside of the reaction vessel 1101. In order to adjust the nitrogen pressure at this time, a pressure adjustment mechanism 1105 is provided. This pressure adjustment mechanism 1105 includes a pressure sensor, a pressure adjustment valve, etc.

Figure 14:
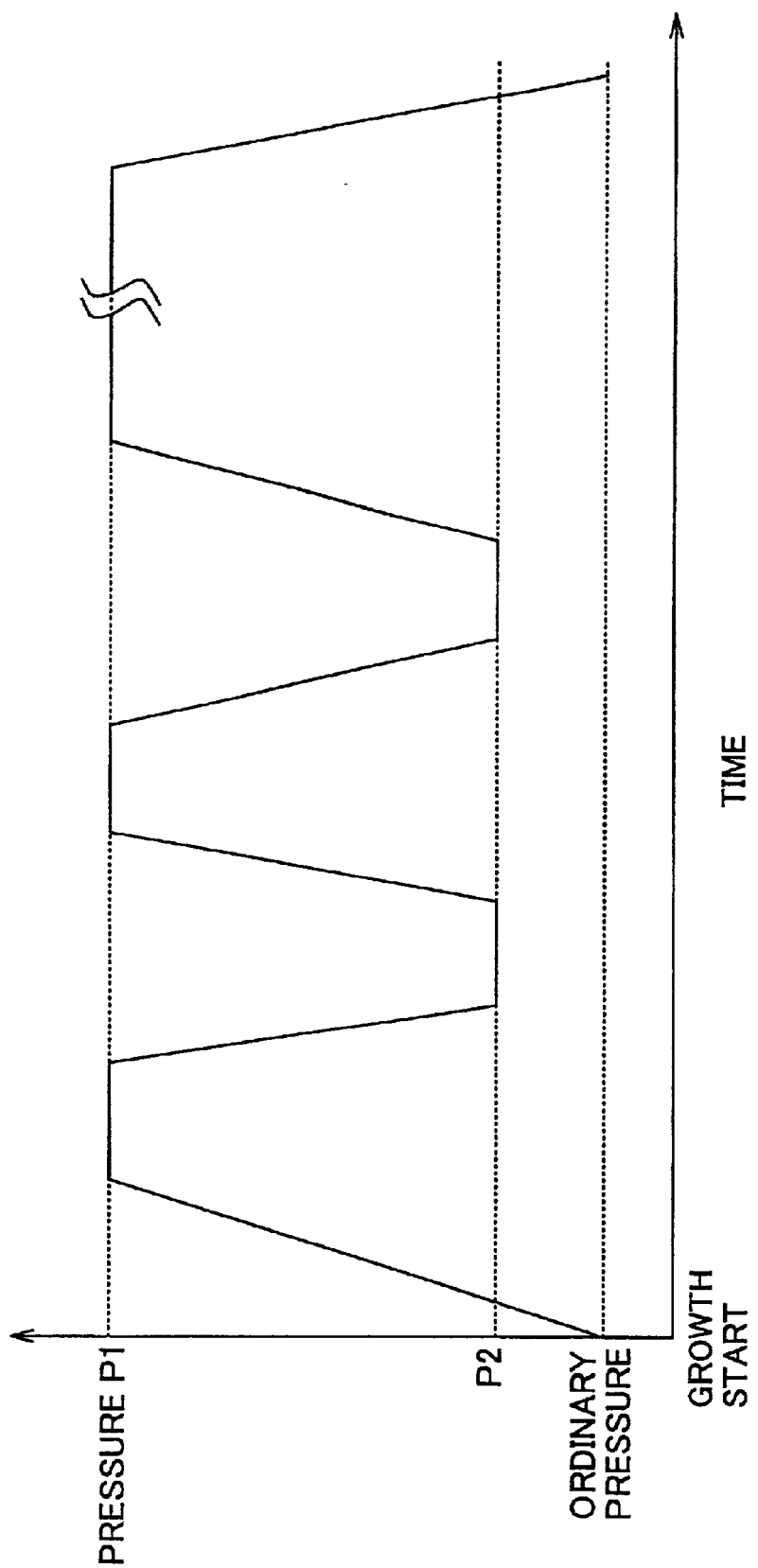
FIG. 14 illustrates a pressure control sequence in a second variant embodiment of the fifth embodiment of the present invention.

In this configuration, the nitrogen pressure in the reaction vessel 1101 is raised to a pressure P1 (for example, 50 atm.) at which crystal growth may start, at a first process as shown in FIG. 14. This state is maintained for a predetermined time interval (for example, 30 minutes), then, a nucleus of a GaN crystal which is the group III nitride is generated in the reaction vessel 1101. Next, the nitrogen pressure in the reaction vessel 1101 is lowered to a pressure P2 (for example, 10 atm.) at which the crystal growth stops. Next, after increasing the nitrogen pressure in the reaction vessel 1101 to the above-mentioned pressure P1 again, this state is maintained for 30 minutes. Then, after that, the nitrogen pressure in the reaction vessel 1101 is again lowered to the above-mentioned pressure P2. The nucleus of the GaN crystal is generated again at the time of this pressure increase.

Then, the nitrogen pressure in the reaction vessel 1101 is increased to the pressure P1, and, then, the thus-raised pressure is maintained till such a time has elapsed that a required crystal size is obtained. At this time, the crystal growth progresses by utilizing the nucleus generated through the first two times of pressure increase, the GaN crystal becomes larger, and the GaN crystals 1107 and 1108 grow on the wall of the reaction vessel 1101 and near the gas-liquid interface between the mixed molten liquid 1102 of Ga and Na and the space zone 1103 in the reaction vessel 1101.

When a case where pressure increase and decrease of the nitrogen pressure for controlling nucleus generation according to the present invention was performed and a case where such a pressure control for controlling nucleus generation was not performed as in the above-mentioned prior art were experimentally compared, nucleus generation was greatly controlled (the number of nucleuses generated could be effectively reduced) in the case where the pressure control for controlling nucleus generation was performed according to the present invention. Consequently, it became possible to enlarge the crystal size and thus the GaN crystal which can be used more practically could be obtained.

In this embodiment, although increase and decrease of the nitrogen pressure in the reaction vessel for the purpose of controlling nucleus generation are repeated twice, a similar effect can be obtained even the same operation is performed only once. It becomes possible to generate a preferential crystal nucleus as this pressure increase and decrease operation is repeated. In addition, the required temperature in the reaction vessel at this time is 750 degrees C., and is remarkably low as compared with the temperature in the super-high-pressure method which is the above-described second prior art.

(Eighth Feature of the Fifth Embodiment of the Present Invention)

In addition to the above-described seventh feature, additional supply of the substance which at least contains the group-III metal is performed at the time the effective nitrogen pressure is lowered.

Figure 15:
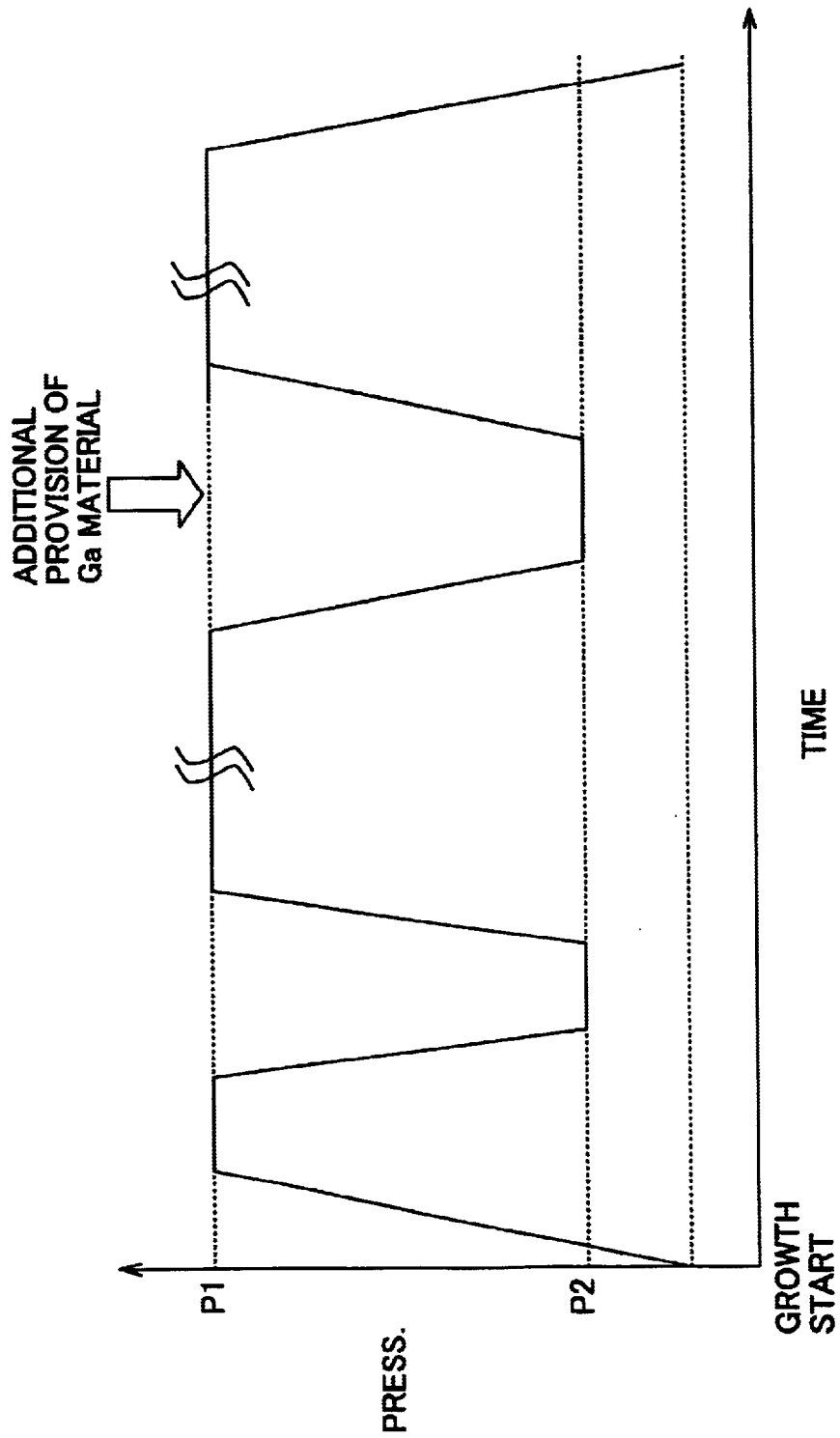
FIG. 15 illustrates a pressure control sequence in a third variant embodiment of the fifth embodiment of the present invention.

A third variant embodiment of the fifth embodiment of the present invention having the above-mentioned eighth feature will now be described with reference to FIG. 15. The crystal growth apparatus shown in FIG. 12 is used in the third variant embodiment of the fifth embodiment. FIG. 15 shows a pressure control sequence of the reaction vessel in this embodiment.

The nitrogen pressure in the reaction vessel 1301 is raised to the pressure P1 (for example, 50 atm.) at which crystal growth starts, in a first process. This state is maintained for a predetermined time interval (for example, 30 minutes), and, then, a nucleus of a GaN crystal which is the group-III nitride is generated in the reaction vessel 1301. Next, the nitrogen pressure in the reaction vessel 1301 is lowered to the pressure P2 (for example, 10 atm.) at which the crystal growth stops. Then, the nitrogen pressure in the reaction vessel 1301 is raised to the above-mentioned pressure P1 again, and this pressure is maintained till such a time interval has elapsed that a certain crystal size is obtained. At this time, the crystal growth progresses utilizing the nucleus generated at the time of the first pressure increase, the GaN crystal thus becomes larger, and the GaN crystal 1307 and the GaN crystal 1308 grow on the wall of the reaction vessel 1301 and near the gas-liquid interface between the mixed molten liquid 1302 of Ga and Na and the space 1303 in the reaction vessel 1301.

As described above, the nitrogen gas which is the nitrogen material can be supplied from the outside, and the nitrogen thus is not exhausted. However, Ga which is the group-III metal material may be exhausted as the GaN crystal growth progresses, or, the ratio thereof with the flux (Na) may be changed even when Ga is not actually exhausted. Thereby, a growth parameter may be changed gradually, and thus, the crystal quality may be changed and it may become difficult to maintain stable crystal growth.

Then, after the crystal growth progresses to some extent, the pressure of the nitrogen in the reaction vessel is lowered to the pressure at which the crystal growth stops, and, thereby, it becomes possible to control the quantity ratio of the group-III metal and the Na flux by carrying out additional supply of the Ga metal, as shown in FIG. 15. Consequently, stable crystal growth of the GaN crystal is attained and it becomes possible to obtain a high-quality crystal having few defects.

Furthermore, fluctuation in the crystal growth can be well controlled by carrying out additional supply of the Ga at a timing at which the crystal growth does not progress, and, thus, it becomes possible to grow up a high-quality GaN crystal.

A crystal growth apparatus such that crystal growth is performed thereby according to the crystal growth method having any of the above-described first through eighth features of the fifth embodiment of the present invention is included in the scope of the present invention.

Furthermore, a group-III nitride crystal obtained through the crystal growth method having the any of the above-described first through eighth features of the fifth embodiment of the present invention, and/or the above-mentioned crystal growth apparatus is included in the scope of the present invention.

A group-III nitride crystal semiconductor device produced by using the above-mentioned group-III nitride crystal is also included in the scope of the present invention.

An embodiment of a semiconductor laser to which the above-mentioned semiconductor device is applied is shown in FIG. 9, and, is the same as that already described above with reference FIG. 9.

Also in this case, as described above, since a group-III nitride crystal (GaN crystal) according to the present invention is used in this semiconductor laser as the substrate 301, there are few crystal defects in the semiconductor laser, and, thus, it provides a large power output and has a long life. Moreover, since the GaN substrate 301 is of n type, an electrode 310 can be formed directly in the substrate 301, thus does not need to draw two electrodes of p side and n side only from the obverse surface as in the prior art shown in FIG. 1, and, thus, cost reduction can be achieved.

Furthermore, in the semiconductor device shown in FIG. 9, it becomes possible to form a light emitting end surface by cleavage, also, chip separation can be performed by cleavage. Thus, it is possible to achieve a high-quality semiconductor device at low cost.

Hereafter, a sixth embodiment of the present invention will now be described with reference to figures. In the sixth embodiment of the present invention, a mixed molten liquid of an alkaline metal and a substance which at least contains a group-III metal is provided in a reaction vessel. When carrying out crystal growth of the group-III nitride including the group-III metal and nitrogen from the mixed molten liquid and a substance which at least contains nitrogen, a local concentration distribution (or concentration unevenness) of dissolved nitrogen is intentionally created in the mixed molten liquid.

There, the local concentration distribution of dissolved nitrogen can be produced in the mixed molten liquid by a specific shape of a vessel holding the mixed molten liquid therein.

A growth method for group-III nitride crystal in the sixth embodiment of the present invention will now be described in detail. In a reaction vessel, an alkaline metal, a substance which at least contains a group-III metal, and a substance which at least contains nitrogen is provided. These materials may be supplied from the outside or may be made to be provided in the reaction vessel originally. A temperature control mechanism is prepared in this reaction vessel, and, thereby, raising the temperature inside of the reaction vessel to a temperature at which crystal growth may occur, lowering the temperature in the reaction vessel to a temperature at which the crystal growth may stop, and maintaining any one of the above-mentioned temperatures in the reaction vessel for a desired time interval can be performed. By thus setting the temperature in the reaction vessel, and the effective nitrogen partial pressure to the conditions by which an group-III nitride crystal may grow, it is possible to make crystal growth of the group-III nitride start.

When a predetermined temperature is set by the above-mentioned temperature control mechanism, the alkaline metal and the substance which at least contains the group-III metal form a mixed molten liquid. Nitrogen is then dissolved in this mixed molten liquid. There, the term 'dissolving' means that the nitrogen is present in the mixed molten liquid in a dissolved form.

The concentration of the dissolved nitrogen in the mixed molten liquid is made to have a spatial (local) distribution (spatial unevenness) in this stage in the sixth embodiment of the present invention. It can be considered that the nitrogen moves towards the inside of the mixed molten liquid from the surface of the mixed molten liquid under a predetermined temperature in a mixed molten liquid holding vessel, and, thereby, a local concentration distribution of the dissolved nitrogen in the mixed molten liquid occurs due to a specific shape of the mixed molten liquid holding vessel which will be described later.

Then, it becomes possible to grow up a crystal of the group-III nitride in a specific zone of the mixed molten liquid by producing such a local concentration distribution of the dissolved nitrogen in the mixed molten liquid. That is, a crystal nucleus is generated at the time in an early stage of crystal growth beginning, and, when the dissolved nitrogen concentration in the mixed molten liquid has a local distribution (unevenness), generation of crystal nucleuses may be limited to a specific zone of the mixed molten liquid accordingly. Then, each crystal nucleus act as a seed crystal, and crystal growth of the group-III nitride progresses therefrom.

Then, after the crystal growth progresses so that a predetermined size of crystal may be obtained thereby, the temperature in the reaction vessel is lowered to such a temperature that the crystal may be taken out from the reaction vessel.

There, the nitrogen mentioned above and below means nitrogen molecules and nitrogen atoms produced from a compound containing nitrogen molecules or nitrogen, and, groups of atoms and groups of molecules containing nitrogen.

As described above, in the sixth embodiment of the present invention, a local concentration distribution of dissolved nitrogen is produced in the mixed molten liquid by an inner shape of a mixed molten liquid holding vessel holding the mixed molten liquid therein.

Figure 16:
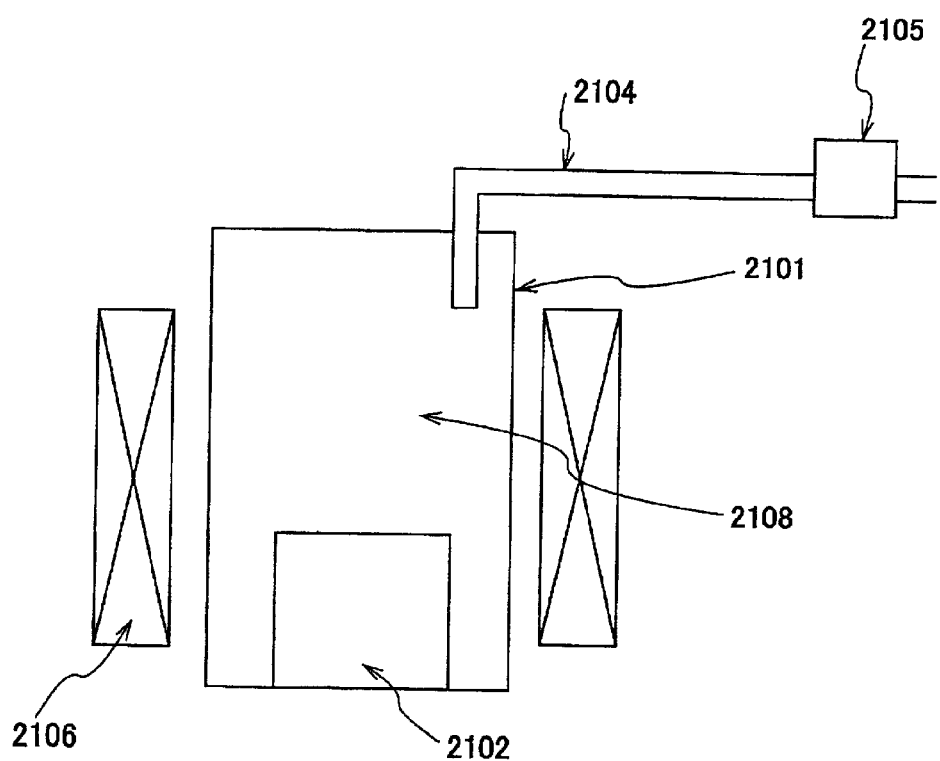
FIG. 16 shows a side-elevational sectional view of a crystal growth apparatus in a sixth embodiment of the present invention.

FIG. 16 shows an example of a configuration of a crystal growth apparatus in the sixth embodiment of the present invention. An alkaline metal and a substance which at least contains a group-III metal (for example, Ga) form a mixed molten liquid in a reaction vessel, and the crystal growth apparatus in the sixth embodiment of the present invention is configured such that growth of crystals of group-III nitride which includes the group-III metal and nitrogen may be carried out from this mixed molten liquid and the substance which at least contains the nitrogen (N).

That is, with reference to FIG. 16, the mixed molten liquid holding vessel 2102 is set in the reaction vessel 2101. There, the material of the mixed molten liquid holding vessel 2102 is BN (boron nitride). Further, the mixed molten liquid holding vessel 2102 holds the mixed molten liquid 2103 including the group-III metal (for example, Ga) and the alkaline metal (for example, Na).

Moreover, with reference to FIG. 16, a heating device 2106 is provided in the reaction vessel 2101 such that the inside of the reaction vessel 2101 can be controlled to have a temperature at which crystal growth may occur. Moreover, a nitrogen supply pipe 2104 is provided such as to supply a nitrogen gas to a space zone 2108 of the reaction vessel 2101 from the outside of the reaction vessel 2101, and, in order to adjust the nitrogen pressure in the reaction vessel 2101, a pressure adjustment mechanism 2105 is provided. This nitrogen pressure adjustment mechanism 2105 includes a pressure sensor, a pressure adjustment valve, etc.

According to the sixth embodiment of the present invention, the mixed molten liquid holding vessel 2102 has an inner shape such as to create a local concentration distribution of dissolved nitrogen in the mixed molten liquid.

Figure 17:
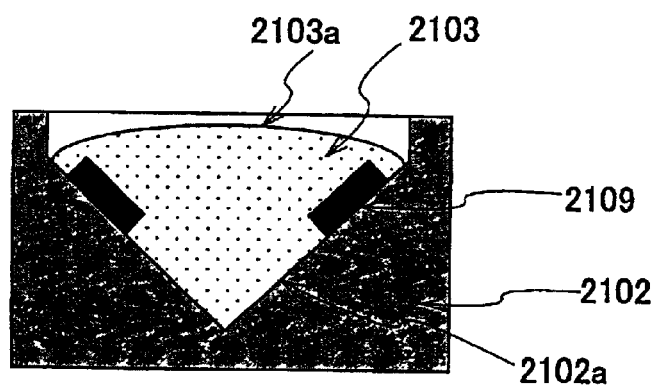
FIG. 17 shows an elevational sectional view of a first example of a mixed molten liquid vessel in the crystal growth apparatus in the sixth embodiment of the present invention.

FIG. 17 shows an elevational sectional view of one example of the mixed molten liquid holding vessel 2102 shown in FIG. 16. The mixed molten liquid holding vessel 2102 shown in FIG. 17 has an inner wall 2102a shaped such that the inner volume (cross sectional area) becomes smaller toward the bottom thereof. That is, the shape of the inner wall 2102a of the mixed molten liquid holding vessel 2102 is a conic shape or a pyramid shape having the pointed vertex thereof directed toward the bottom. That is, in the example shown in FIG. 17, the mixed molten liquid 2103 is held at a portion surrounded by the inner wall 2102a having the shape obtained from being shaved off into a conic shape having the vertex directed to the bottom.

In the crystal growth apparatus having the configuration shown in FIGS. 16 and 17, the nitrogen pressure in the reaction vessel 2101 is made into 50 atm., and the temperature therein is increased to the temperature of 750 degrees C. by which crystal growth starts. By maintaining this growth condition for a predetermined time interval, a group-III nitride crystal (for example, GaN crystal) 2109 grows in the mixed molten liquid holding vessel 2102. A nucleus of the group-III nitride crystal (for example, GaN crystal) 2109 is generated and the crystal growth progresses therefrom at the earlier stage of the crystal growth, and, a zone in which the group-III nitride crystal (for example, GaN crystal) 2109 grows is only an upper part of the mixed molten liquid holding vessel 2102 where the inner wall 2102a is inclined as shown in FIG. 17.

If the shape of the inner wall 2102a of the mixed molten liquid holding vessel 2102 did not have the shape shown in FIG. 17 (conic shape or pyramid shape) but a pillar shape (cylinder) or a square pillar shape (prism), nucleuses of the group-III nitride crystal (for example, GaN crystal) 2109 would grow all over the inner wall 2102a of the mixed molten liquid holding vessel 2102, and the group-III nitride crystal (for example, GaN crystal) 2109 in monocrystal would not become larger enough. In contrast thereto, when the shape of the inner wall 2102a of the mixed molten liquid holding vessel 2102 is such as that shown in FIG. 17, nucleus generation of the group-III nitride crystal (for example, GaN crystal) 2109 is limited to occur in a specific zone of the mixed molten liquid 2103, it becomes possible to efficiently utilize the group-III metal (for example, Ga) in the mixed molten liquid 2103 for the growth of the group-III nitride monocrystal (for example, GaN single crystal), and, thus, it becomes possible to obtain a large size of the crystal.

It can be considered that such a behavior occurs due to the following mechanism: That is, the nitrogen from the nitrogen gas by which the space zone 2108 of the reaction vessel 2101 is filled up is dissolved into the mixed molten liquid 2103 from the surface 2103a of the mixed molten liquid 2103 (it moves by dispersion into a deeper part of the mixed molten liquid 103 from the surface 2103a of the mixed molten liquid 2103). When the shape of the inner wall 2102a of the mixed molten liquid holding vessel 2102 is such as that shown in FIG. 17, the cross sectional shape of the inner wall 2102a of the mixed molten liquid holding vessel 2102 along a direction perpendicular to the direction in which the nitrogen moves in the mixed molten liquid 2103 to the inside of the mixed molten liquid 2103 by dispersion from the surface 2103a of the mixed molten liquid 2103 (namely, along the direction from the top to the bottom) is changed. Thereby, the dissolved nitrogen concentration in the inside of the mixed molten liquid 2103 has a spatial difference (distribution), and, thus, the crystal nucleus of the group-III nitride crystal (for example, GaN crystal) 2109 is generated in the above-mentioned specific part of inner wall 2102a of the mixed molten liquid holding vessel 2102.

That is, when the cross sectional area of the inner wall 2102a of the mixed molten liquid holding vessel 2102 is changed (when the cross sectional area of the mixed molten liquid 103 is changed by the shape of the inner wall 2102a of the vessel 2102), the local distribution (unevenness) of the dissolved nitrogen concentration arises in the mixed molten liquid 2103. Consequently, generation of crystal nucleuses of the group-III nitride crystal (for example, GaN crystal) 2109 occurs in a limited part in the mixed molten liquid 2103. Growth of the group-III nitride crystal (for example, GaN crystal) 2109 progresses further from the generated crystal nucleus, and, thus, the crystal growth progresses more preferentially from a crystal nucleus already generated once than in a zone in which no crystal nucleus is present. At this time, the temperature of the mixed molten liquid holding vessel 2102 and the mixed molten liquid 2103 of the inside thereof is uniform. Therefore, from the surface 2103a of the mixed molten liquid 2103, the nitrogen used as a group-V material for the group-III nitride crystal (for example, GaN crystal) 2109 moves by dispersion, and is consumed in crystal nucleuses of the III group-III nitride crystal (for example, GaN crystal) 2109. Consequently, the group-III nitride crystal (for example, GaN crystal) 2109 grows up only in the specific part of the inner wall 2102a of the mixed molten liquid holding vessel 2102, and, thereby, growth of the group-III nitride crystal 2109 into a large size of crystal (for example, GaN crystal) is attained.

Figure 18:
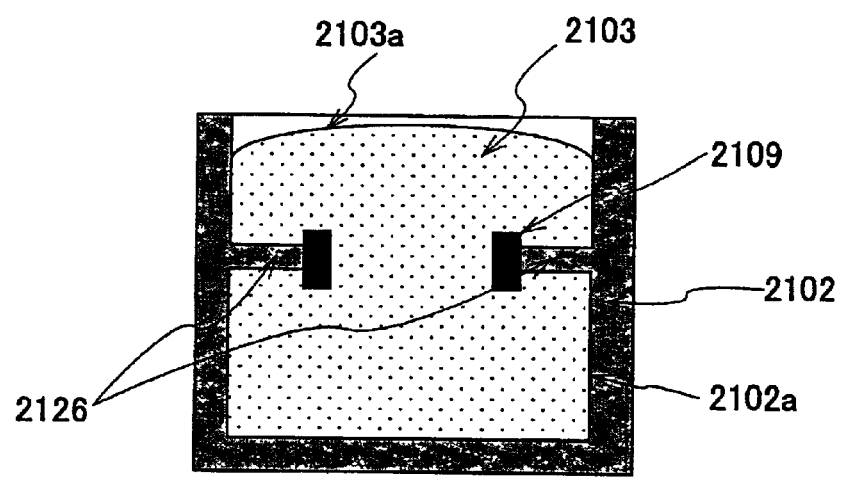
FIG. 18 shows an elevational sectional view of a second example of the mixed molten liquid vessel in the crystal growth apparatus in the sixth embodiment of the present invention.

FIG. 18 shows a second example of the mixed molten liquid holding vessel 2102 in the sixth embodiment of the present invention. In the example shown in FIG. 18, the mixed molten liquid holding vessel 2102 has a configuration such that a projection 2126 is formed from the inner wall 2102a of the mixed molten liquid holding vessel 2102 at a level (height) below the surface 2103a of the mixed molten liquid 2103.

When growing up the group-III nitride crystal (for example, GaN crystal) 2109 using the mixed molten liquid holding vessel 2102 shown in FIG. 18, a nucleus of the group-III nitride crystal (for example, GaN crystal) 2109 is generated centering near the projection end of the projection 2126 of the inner wall 2102a of the mixed molten liquid holding vessel 2102. Generation of the nucleus of the group-III nitride crystal (for example, GaN crystal) 2109 occurs mainly near the projection end of the projection 2126 in the mixed molten liquid 103. Thereby, the crystal nucleus at this location is mainly used for progress of growth of the group-III nitride crystal (for example, GaN crystal) 2109, and, thus, it becomes possible to grow up a large-sized crystal.

In the crystal growth apparatus having the configuration shown in FIGS. 16 and 18, the nitrogen pressure in the reaction vessel 2101 is made into 50 atm., and the temperature therein is increased to the temperature of 750 degrees C. at which crystal growth starts. By maintaining this growth condition for a predetermined time interval, the group-III nitride crystal (for example, GaN crystal) 2109 grows in the mixed molten liquid holding vessel 2102. At this time, a nucleus of the group-III nitride crystal (for example, GaN crystal) 2109 is generated and crystal growth progresses therefrom in the earlier stage of crystal growth, and the zone at which the group-III nitride crystal (for example, GaN crystal) 2109 grows is limited to only a zone near the projection end of the projection 2126 of the inner wall 2102a of the mixed molten liquid holding vessel 2102 as shown in FIG. 18.

It can be considered that such a behavior occurs by the following mechanism: Namely, in the reaction vessel 2101, nitrogen from the nitrogen gas by which the space zone 2108 is filled is dissolved into the mixed molten liquid 2103 from the surface 2103a of the mixed molten liquid 2103 (it moves by dispersion into the mixed molten liquid 2103 deeper from the surface 2103a of the mixed molten liquid 2103). In the case of the example shown in FIG. 18, the cross sectional area inside the mixed molten liquid holding vessel 2102 along the direction perpendicular to the direction of movement of the nitrogen in the mixed molten liquid 103 is changed by the projection 2126 formed from the inner wall 2102a of the mixed molten liquid holding vessel 2102. Thereby, the concentration of the dissolved nitrogen in the mixed molten liquid 2103 has a spatial difference/unevenness (distribution), and the crystal nucleus of the group-III nitride crystal (for example, GaN crystal) 2109 is generated centering in the neighborhood of the projection 2126. In this time, growth of the group-III nitride crystal (for example, GaN crystal) 2109 progresses further from the generated crystal nucleus, and thus, the crystal growth progresses more preferentially from the crystal nucleus already generated than in a zone in which no crystal nucleus is present. At this time, the temperature in the mixed molten liquid holding vessel 2102 and the mixed molten liquid 2103 of the inside thereof is uniform. Thereby, from the surface 2103a of the mixed molten liquid 2103, the nitrogen used as the group-V material for the group-III nitride crystal (for example, GaN crystal) 2109 moves by dispersion, and is consumed in the crystal nucleus of the group-III nitride crystal (for example, GaN crystal) 2109. Consequently, the group-III nitride crystal (for example, GaN crystal) 2109 grows up only in the specific part on the inner wall 102a of the mixed molten liquid holding vessel 2102, and, thus, growth of the group-III nitride crystal 2109 into a large-sized crystal (for example, GaN crystal) is attained.

In the example of FIG. 18, the projection 2126 is formed from the inner wall 2102a of the mixed molten liquid holding vessel 2102. However, a measure may be provided instead of provision of such a projection. Namely, the mixed molten liquid holding vessel 2102 should have a certain portion at which the cross sectional area is changed in the inner wall 2102a.

Figure 19:
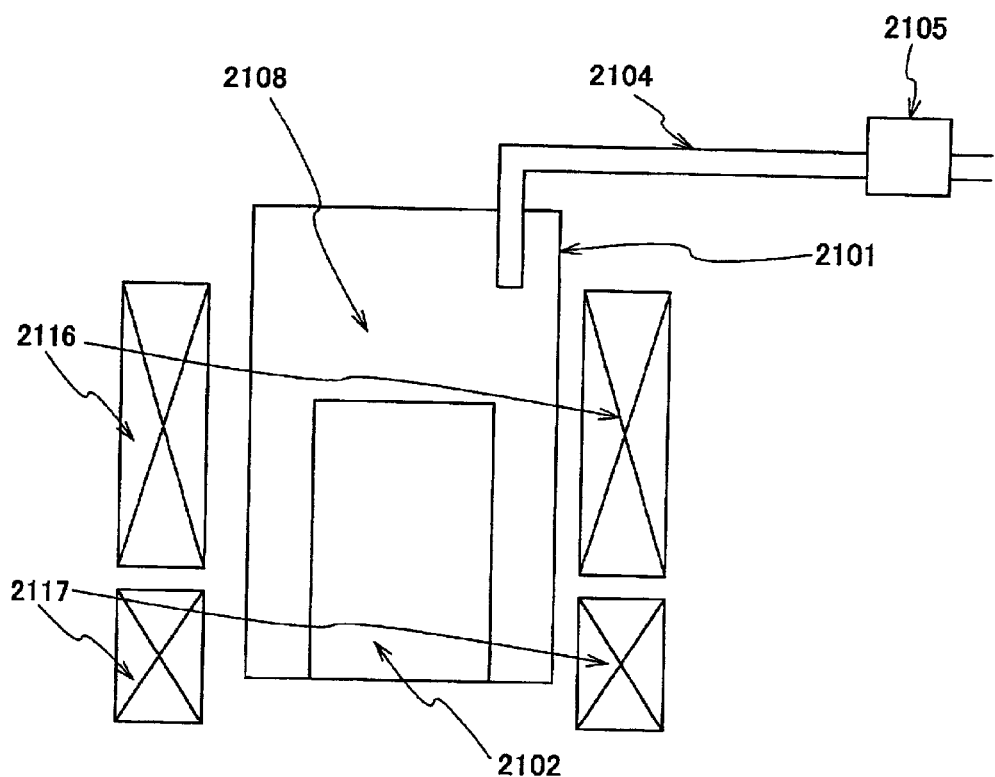
FIG. 19 shows a side-elevational sectional view of a crystal growth apparatus in a seventh embodiment of the present invention.

FIG. 19 shows a configuration of a crystal growth apparatus in a seventh embodiment of the present invention. In FIG. 19, the same reference numerals as those of FIG. 16 are given to corresponding parts/components. In the crystal growth apparatus shown in FIG. 19, a first heating device 2116 and a second heating device 2117 are provided such that the group-III nitride crystal (for example, GaN crystal) 2109 in the reaction vessel 2101 can be controlled to have a temperature by which crystal growth may occur. There, temperature control can be performed individually by the first heating device 2116 and the second heating device 2117.

Figure 20A:
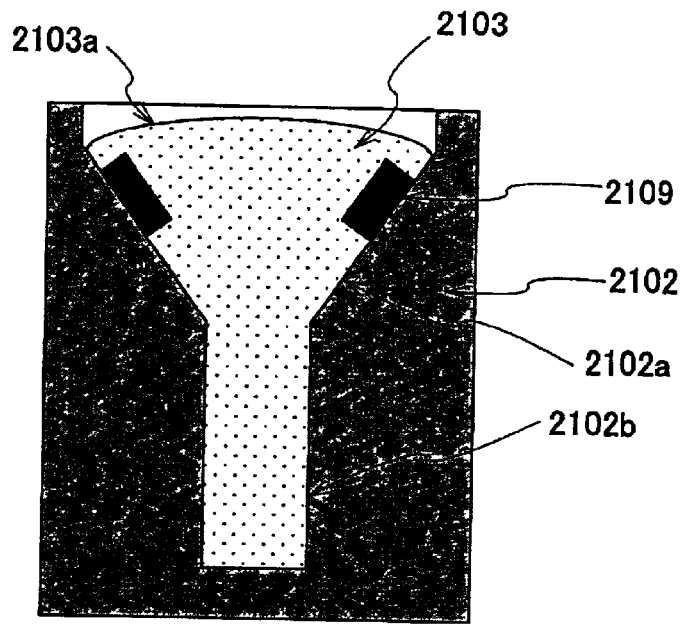
FIG. 20A shows an elevational sectional view of a first example of a mixed molten liquid vessel in the crystal growth apparatus in the seventh embodiment of the present invention.

FIG. 20A shows another example of the mixed molten liquid holding vessel 2102, and the mixed molten liquid holding vessel 2102 shown in FIG. 20A is used in the crystal growth apparatus shown in FIG. 19. With reference to FIG. 20A, this mixed molten liquid holding vessel 2102 has an upper inner wall 2102a and a lower inner wall 2102b. The upper inner wall 2102a has an inner volume (cross sectional area) becoming smaller toward the bottom, while the lower inner wall 2102b has a uniform cross sectional area. That is, the three-dimensional shape of the inner wall of the mixed molten liquid holding vessel 2102 shown in FIG. 20A is such that a cone having a vertex directed downward is truncated, and, then, from the thus-produced bottom end plane thereof, a cylindrical shape extends downward further.

In the crystal growth apparatus having the configuration shown in FIGS. 19 and 20A, nitrogen pressure in the reaction vessel 2101 is made into 50 atm., and the temperature therein at the upper part (2102a) of the mixed molten liquid holding vessel 2102 is increased by the first heating device 2116 to a temperature of 750 degrees C. at which crystal growth may start. The temperature of the lower part (2102b) of the mixed molten liquid holding vessel 2102 is made into 780 degrees C. by the second heating device 2117. By maintaining this growth condition for a predetermined time interval, the group-III nitride crystal (for example, GaN crystal) 2109 grows in the mixed molten liquid holding vessel 2102. In this time, a nucleus of the group-III nitride crystal (for example, GaN crystal) 109 is generated, and crystal growth progresses in the earlier stage of the crystal growth therefrom, and only in the upper part, the group-III nitride crystal (for example, GaN crystal) 2109 grows in which the inner wall of the mixed molten liquid holding vessel 2102 is inclined as shown in FIG. 20A (only in the specific part on the upper inner wall 2102a).

The crystal nucleus 2109 of the group-III nitride crystal (for example, GaN crystal) is generated only in the specific part on the upper inner wall 2102a of the mixed molten liquid holding vessel 2102 same as in the example shown in FIG. 17. However, differently from the example shown in FIG. 17, the inner wall of the mixed molten liquid holding vessel 2102 has the cylindrical lower part 2102b in which the cross sectional area is uniform, in the mixed molten liquid holding vessel shown in FIG. 20A. As mentioned above, when the inner wall of the mixed molten liquid holding vessel were like a cylinder or a prism, nucleuses of the group-III nitride crystal (for example, GaN crystal) 2109 would grow all over the inner wall of the mixed molten liquid holding vessel, and the group-III nitride crystal (for example, GaN crystal) 2109 in monocrystal thus could not have a large size. When the mixed molten liquid holding vessel is shaped as shown in FIG. 20A, nucleus generation is limited to effectively occur only in the specific zone, the group-III metal in the mixed molten liquid (for example, Ga) can thus be efficiently used for the growth of the group-III nitride monocrystal (for example, GaN single crystal) 2109 from the nucleus thus generated in the limited zone, and thereby, a large-sized crystal can be obtained therefrom. Furthermore, in the configuration shown in FIG. 20A, the cross sectional area of the inner wall of the mixed molten liquid holding vessel 2102 becomes uniform below the mid height thereof. That is, the lower inner wall 2102b has the uniform cross sectional area. Thereby, growth of the group-III nitride crystal (for example, GaN crystal) 2109 is controlled there, but the mixed molten liquid which includes the group-III metal (Ga) and the alkaline metal (for example, Na) is kept. Thereby, the zone of the lower inner wall 2102*b* acts as a zone for keeping the group-III metal (for example, Ga) for the group-III nitride crystal (for example, GaN crystal) 2109, and, thereby, the group-III metal (for example, Ga) can be continuously supplied therefrom, and the crystal can thus be grown up continuously to a sufficient size.

Furthermore, in the crystal growth apparatus shown in FIGS. 19 and 20A, a convection arises in the mixed molten liquid 2103 because there is a difference in temperature between the upper part and the lower part of the mixed molten liquid holding vessel 2102 as mentioned above. The group-III metal (for example, Ga) is supplied from the lower part of the mixed molten liquid holding vessel 2102 by this convection, and the nitrogen which is the group-V material is supplied from the top, and, thus, efficient crystal growth is attained.

Figure 20B:
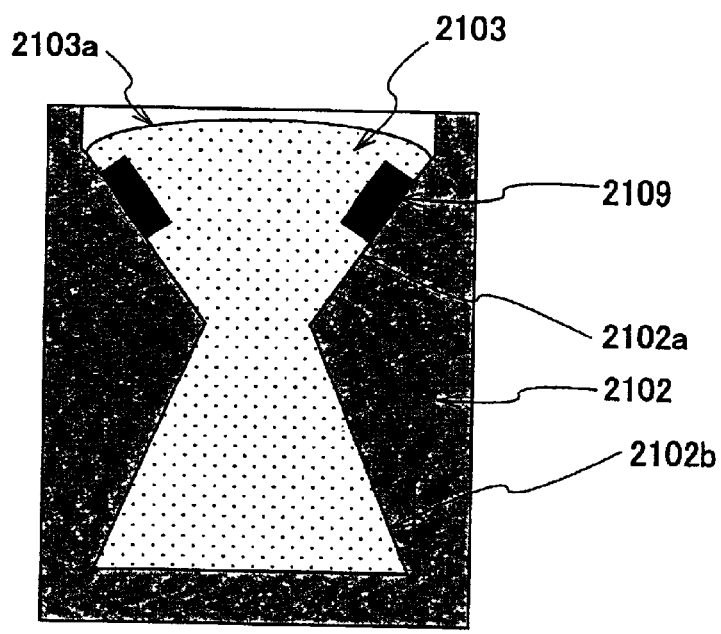
FIG. 20B shows an elevational sectional view of a second example of the mixed molten liquid vessel in the crystal growth apparatus in the seventh embodiment of the present invention.

In addition, in the example of the crystal growth apparatus shown in FIG. 20A, although the shape of the inner wall of the mixed molten liquid holding vessel 2102 is such that, first, the cross sectional area thereof becomes smaller downward, and, then, is uniform from the middle thereof as mentioned above, the shape of the inner wall of the mixed molten liquid holding vessel 2102 may be such that, as shown in FIG. 20B, first, the cross sectional area may become smaller downward, and, then, from the middle height thereof, it may become larger downward (like a tsuzumi or Japanese hand drum).

Moreover, the inner shape of the mixed molten liquid holding vessel 2102 is not necessarily limited to any one of those shown in FIGS. 17, 18, 20A and 20B, but, should just be a shape such that, thereby, a local distribution of dissolved nitrogen concentration is produced in the mixed molten liquid 2103. Moreover, not only providing a special shape of the inner wall of the mixed molten liquid holding vessel 2102 but also some special member, such as a jig, a mechanical device or the like, may be provided/attached, other than the vessel 2102 itself, in the vessel 2102, for the same purpose.

Moreover, in each of the above-mentioned embodiments, Na is used as a metal (alkaline metal) having a low melting point and a high vapor pressure. However, instead of Na, potassium (K) or the like may be used. That is, as the alkaline metal, any alkaline metal may be used as long as it becomes a molten liquid at a temperature at which a crystal of a group-III nitride may grow.

Moreover, although a case where Ga is used as a substance which at least contains a group-III metallic element has been described in each of the above-mentioned embodiments, a metal of a simple substance, such as Al, In, or any mixture thereof, an alloy, etc. may also be used instead of Ga.

Moreover, although a nitrogen gas is used in each of the above-mentioned embodiments as a substance which at least contains a nitrogen element, another gas such as $NH_3$ may be used instead of the nitrogen gas.

By carrying out crystal growth of a group-III nitride crystal using the crystal growth method according to the present invention described above and the crystal growth apparatus according to the present invention, a large-sized group-III nitride crystal can be provided at low cost.

As an example of the growth method of a group-III nitride crystal according to the present invention described above, Ga is used as the group-III metal, a nitrogen gas is used as the nitrogen material, Na is used as the flux, a temperature of the reaction vessel and flux vessel is made into 750 degrees C., and the nitrogen pressure is fixed at 50 kg/cm$^2$. A GaN crystal can grow under such conditions.

Moreover, a group-III nitride semiconductor device can be produced using the group-III nitride crystal grown up by the growth method according to the present invention.

FIG. 9 shows one example of a configuration of the semiconductor device according to the present invention, which is the same as that described above with reference to FIG. 9.

Since the group-III nitride crystal (GaN crystal) according to the present invention is used for this semiconductor laser as the substrate 301 shown in FIG. 9, there are few crystal defects in this semiconductor laser device, and, thus, it has a large output and a long life. Moreover, since the GaN substrate 301 is of n type, the electrode 310 can be directly formed on the substrate 301, and, thus, there is no need to draw out two electrodes of the p side and the n side only from the obverse surface as in the first prior art (FIG. 1), and, thus, it becomes possible to attain cost reduction.

Furthermore, in the semiconductor device of FIG. 9, it becomes possible to form the light emitting end surface by cleavage, and, also, it becomes possible to perform chip separation by cleavage. Thus, it becomes possible to realize a high-quality device at low cost.

In addition, although InGaN MQW is used as the activity layer in the above-mentioned example, it is also possible to shorten the wavelength of light emitted by using AlGaN MQW as the activity layer, instead. According to the present invention, light emission from a deep level is reduced as the GaN substrate thus has few defects and few impurities. Accordingly, it is possible to thus provide a light-emission device having a high efficiency even when the wavelength of the light emitted is shortened.

Specifically, a light-emission device which emits light having a wavelength shorter than 400 nm (light-emission device which has a satisfactory performance even in the ultraviolet region) as the group-III nitride semiconductor device can be provided. That is, according to the prior art, the light-emission spectrum of a GaN film is such that most of the light-emission is made from a deep level. Accordingly, the device characteristic is not satisfactory for the wavelength shorter than 400 nm. In contrast thereto, according to the present invention, the light-emission device having the satisfactory characteristic also for the ultraviolet region can be provided.

Further, any combination of the above-described embodiments may be included in the scope of the present invention.

Moreover, although each of the above-mentioned embodiments is an application of the present invention to an optical device, the present invention may also be applied to an electronic device. That is, by using a GaN substrate with few defects according to the present invention, a GaN-family thin film formed thereon by epitaxial growth also has few crystal defects. Consequently, the leak current can be well controlled, a career confining effect when a quantum structure is made can be improved, for example. Thus, a high-performance device can be achieved according to the present invention.

Further, the present invention is not limited to the above-described embodiments, and variations and modifications may be made without departing from the scope of the present invention.

The present application is based on Japanese priority applications Nos. 2000-318723, 2000-318988 and 2000-324272, filed on Oct. 19, 2000, Oct. 19, 2000 and Oct. 24, 2000, the entire contents of which are hereby incorporated by reference.

What is claimed is:

1. A crystal growth method, comprising the steps of:
   a) supplying a nitrogen material into a reaction vessel containing a mixed molten liquid comprising an alkaline metal and a group-III metal; and
   b) growing a crystal of a group-III nitride using the mixed molten liquid and the nitrogen material supplied in said step a) in said reaction vessel,
   wherein a provision is made such as to cause a vapor of the alkaline metal to stay inside said reaction vessel.

2. The method as claimed in claim 1, further comprising:
   providing another reaction vessel outside of said reaction vessel;
   supplying the nitrogen material into the inner reaction vessel through the thus-provided outer reaction vessel; and
   allowing the nitrogen material to be brought into said inner reaction vessel from said outer reaction vessel, and causing the vapor of the alkaline metal to stay inside said inner reaction vessel.

3. A crystal growth method, comprising the steps of:
   a) supplying a nitrogen material into a reaction vessel containing a mixed molten liquid comprising an alkaline metal and a group-III metal; and
   b) growing a crystal of a group-III nitride using the mixed molten liquid and the nitrogen material brought in by said step a) in said reaction vessel,
   wherein a provision is made such as to prevent a vapor of the alkaline metal from blocking a zone through which the nitrogen material is supplied from the outside of said reaction vessel.

4. The method as claimed in claim 3, wherein the temperature of said zone is controlled.

5. The method as claimed in claim 3, wherein a temperature in said reaction vessel above the surface of the mixed molten liquid is controlled so as to prevent the vapor of the alkaline metal from condensing.

6. The method as claimed in claim 3, wherein the nitrogen material is supplied horizontally or from a direction below the horizontal direction.

7. A crystal growth method comprising the steps of:
   a) carrying out crystal growth in a reaction vessel of a group-III nitride comprising a group-III metal and a nitrogen from an alkaline metal, a substance comprising the group-III metal, and a substance comprising the nitrogen; and
   b) maintaining a growth condition for a crystal of the group-III nitride at a condition at which the crystal growth starts; then,
   c) maintaining the growth condition at a condition at which the crystal growth stops; and, then,
   d) again setting the condition at which the crystal growth starts.

8. The method as claimed in claim 7, wherein:
   said step b) maintains the temperature of a zone in which a crystal of the group-III nitride grows at a temperature at which the crystal growth starts;
   said step c) lowers the temperature of said zone to a temperature such that no alloy is formed between the group-III metal and another metal, and maintaining the temperature; and
   said step d) increases the temperature to the temperature at which the crystal growth starts again.

9. The method as claimed in claim 8, wherein increase and decrease of the temperature are performed several times.

10. The method as claimed in claim 8, wherein the substance comprising the nitrogen in a form of a gas, and the gas is supplied into the reaction vessel continuously at a predetermined pressure.

11. The method as claimed in claim 8, wherein the substance comprising the group-III metal is additionally provided at the time the temperature is lowered.

12. The method as claimed in claim 7, wherein:
    said step b) maintains an effective pressure of the substance comprising the nitride in a form a gas in a zone in which a crystal of the group-III nitride grows at a pressure at which the crystal growth starts;
    said step c) lowers the effective pressure of the nitrogen gas in said zone to a pressure such that the crystal growth stops, and maintaining the pressure; and
    said step d) increases the effective pressure of the nitrogen gas to the pressure at which the crystal growth starts again.

13. The method as claimed in claim 12, wherein increase and decrease of the effective pressure of the nitrogen gas are performed several times.

14. The method as claimed in claim 12, wherein the substance comprising the group-III metal is additionally provided at the time the effective pressure of the nitrogen gas is lowered.

15. A crystal growth method, comprising the steps of:
    a) forming a mixed molten liquid comprising an alkaline metal and a substance comprising a group-III metal in a liquid holding vessel;
    b) growing in said liquid holding vessel a crystal of a group-III nitride comprising the group-III metal and nitride from the mixed molten liquid and a substance comprising the nitride;
    c) creating a local concentration distribution of dissolved nitrogen in the mixed molten liquid in said liquid holding vessel during said step b).

16. The method as claimed in claim 15, further comprising providing said liquid holding vessel with an inner shape such as to create the local concentration distribution of the dissolved nitrogen in the mixed molten liquid.

17. The method as claimed in claim 16, further comprising providing said inner shape of said liquid holding vessel with a cross sectional area which becomes smaller downward.

18. The method as claimed in claim 16, further comprising providing said inner shape of said liquid holding vessel with a cross sectional area which is reduced partially.

19. The method as claimed in claim 16, further comprising providing said inner shape of said liquid holding vessel with a cross sectional area which becomes smaller downward first, and, then, is uniform downward from a mid height.

20. The method as claimed in claim 16, further comprising providing said inner shape of said liquid holding vessel with a cross sectional area which becomes smaller downward first, and, then, becomes larger downward from a mid height.

* * * * *